(12) United States Patent
Kim et al.

(10) Patent No.: US 11,984,467 B2
(45) Date of Patent: May 14, 2024

(54) IMAGE SENSOR AND IMAGE SENSING DEVICE

(71) Applicant: SAMSUNG ELECTRONICS CO., LTD., Suwon-si (KR)

(72) Inventors: Dae Shik Kim, Hwaseong-si (KR); Min-Sun Keel, Seoul (KR); Sang Kil Lee, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 387 days.

(21) Appl. No.: 17/368,112

(22) Filed: Jul. 6, 2021

(65) Prior Publication Data

US 2022/0139991 A1 May 5, 2022

(30) Foreign Application Priority Data

Nov. 3, 2020 (KR) .................. 10-2020-0144925

(51) Int. Cl.
*H01L 27/146* (2006.01)
*H01L 25/065* (2023.01)
*H10B 61/00* (2023.01)

(52) U.S. Cl.
CPC .... *H01L 27/14636* (2013.01); *H01L 25/0657* (2013.01); *H01L 27/1462* (2013.01); *H01L 27/14634* (2013.01); *H10B 61/00* (2023.02)

(58) Field of Classification Search
CPC ......... H01L 27/14636; H01L 27/14634; H01L 27/14609; H10B 61/00; H10B 61/22
See application file for complete search history.

(56) References Cited

U.S. PATENT DOCUMENTS

| | | | |
|---|---|---|---|
| 8,120,949 B2 | 2/2012 | Ranjan et al. | |
| 9,047,964 B2 | 6/2015 | Lee et al. | |
| 9,972,772 B2 | 5/2018 | Umebayashi et al. | |
| 10,157,951 B2 | 12/2018 | Kim et al. | |
| 10,388,859 B2 | 8/2019 | Kim et al. | |
| 2010/0019297 A1 | 1/2010 | Hwang | |
| 2012/0134200 A1 | 5/2012 | Khoueir et al. | |
| 2018/0040658 A1* | 2/2018 | Kang | H01L 31/0203 |

(Continued)

OTHER PUBLICATIONS

Tim Saxe and Brian Faith, Metal layers a key to interconnect delay? EE Times, Jun. 23, 2003 (Year: 2003).*

(Continued)

*Primary Examiner* — Shih Tsun A Chou
(74) *Attorney, Agent, or Firm* — Fish & Richardson P.C.

(57) ABSTRACT

An image sensor includes an upper chip having a pixel array connected to a first connecting structure, and a lower chip below the upper chip and having a second connecting structure connected to the first connecting structure and having first and second stacked metal layers with a same thickness, a third metal layer on the second metal layer and thicker than the second metal layer, a fourth metal layer on the third metal layer and thicker than the third metal layer, first through third insulating layers alternating with the first through fourth metal layers, a first memory device with a first MTJ element in at least one of the first and second insulating layers, and a second memory device with a second MTJ element different from the first MTJ element, the second MTJ element being in at least one of the first through third insulating layers.

19 Claims, 37 Drawing Sheets

(56) References Cited

U.S. PATENT DOCUMENTS

2018/0204867 A1\* 7/2018 Kim .................. H01L 24/80
2018/0211910 A1\* 7/2018 Lee .................. H01L 23/528
2019/0206929 A1   7/2019 Pinarbasi et al.

OTHER PUBLICATIONS

Junpei Inoue et al., Evaluation of On-Chip Transmission Line Interconnect Using Wire Length Distribution, Proceedings of the 2005 Asia and South Pacific Design Automation Conference, Jan. 2005, pp. 133-138 (Year: 2005).\*

\* cited by examiner

IMAGE SENSOR AND IMAGE SENSING DEVICE

CROSS-REFERENCE TO RELATED APPLICATION

Korean Patent Application No. 10-2020-0144925, filed on Nov. 3, 2020 in the Korean Intellectual Property Office, and entitled: "Image Sensor and Image Sensing Device," is incorporated by reference herein in its entirety.

BACKGROUND

1. Field

The present disclosure relates to an image sensor and an image sensing device.

2. Description of the Related Art

An image sensing device is a type of semiconductor device that converts optical information into electrical signals. Examples of the image sensing device include a charge-coupled device (CCD) image sensing device and a complementary metal-oxide semiconductor (CMOS)-type image sensing device.

The CMOS-type image sensor may also be referred to as a CMOS image sensor (CIS). The CIS may include a plurality of pixels that are arranged two-dimensionally. Each of the pixels may include, e.g., a photodiode. The photodiode converts incident light into an electrical signal.

Recently, in accordance with developments in the computer and communication industries, the demand for image sensors with improved performance has grown in various fields such as the fields of digital cameras, camcorders, smartphones, gaming devices, security cameras, medical micro cameras and robots.

SUMMARY

According to an embodiment, an image sensor includes an upper chip including a pixel array and a first connecting structure, which is connected to the pixel array; and a lower chip disposed below the upper chip, the lower chip including a second connecting structure, which is connected to the first connecting structure, first memory device and second memory device, wherein the first memory device includes a first magnetic tunnel junction (MTJ) element, the second memory device includes a second magnetic tunnel junction element, which is different from the first magnetic tunnel junction element, the second connecting structure includes a first metal layer, a second metal layer, which is disposed on the first metal layer and has the same thickness as the first metal layer, a third metal layer, which is disposed on the second metal layer and is thicker than the second metal layer, a fourth metal layer, which is disposed on the third metal layer and is thicker than the third metal layer, a first insulating layer, which is disposed between the first and second metal layers, a second insulating layer, which is disposed between the second and third metal layers, and a third insulating layer, which is disposed between the third and fourth metal layers, the first magnetic tunnel junction element is disposed in at least one of the first and second insulating layers, and the second magnetic tunnel junction element is disposed in at least one of the first through third insulating layers.

According to the aforementioned and other embodiments, an image sensor includes an upper chip including a pixel array and a first connecting structure, which is connected to the pixel array; a middle chip disposed below the upper chip, the middle chip including a second connecting structure, which is connected to the first connecting structure, first memory device and second memory device; and a lower chip disposed below the middle chip, the lower chip including a third connecting structure, which is connected to the second connecting structure, wherein the first memory device is a first magnetic tunnel junction (MTJ) element, the second memory device includes a second magnetic tunnel junction element, which is different from the first magnetic tunnel junction element, the second connecting structure includes a first metal layer, a second metal layer, which is disposed on the first metal layer and has the same thickness as the first metal layer, a third metal layer, which is disposed on the second metal layer and is thicker than the second metal layer, a first insulating layer, which is disposed between the first and second metal layers, and a second insulating layer, which is disposed between the second and third metal layers, the first magnetic tunnel junction element is disposed in at least one of the first and second insulating layers, and the second magnetic tunnel junction element is disposed in at least one of the first and second insulating layers.

According to the aforementioned and other embodiments, an image sensing device includes an image sensor; and an image signal processor processing an image signal provided from the image sensor, wherein the image sensor includes a pixel array, a connecting structure, which receives signals generated by the pixel array, a first memory device, which includes a first magnetic tunnel junction (MTJ) element, and a second memory device, which includes a second magnetic tunnel junction element different from the first magnetic tunnel junction element, the connecting structure includes a first metal layer, a second metal layer, which is disposed on the first metal layer, a third metal layer, which is disposed on the second metal layer, a fourth metal layer, which is disposed on the third metal layer, a first insulating layer, which is disposed between the first and second metal layers, a second insulating layer, which is disposed between the second and third metal layers, and a third insulating layer, which is disposed between the third and fourth metal layers, the first magnetic tunnel junction element is disposed in at least one of the first and second insulating layers, the second magnetic tunnel junction element is disposed in at least one of the first through third insulating layers, the first memory device stores signals generated by the pixel array in the first magnetic tunnel junction element and provides the stored signals to the image signal processor, and the second memory device stores data read out from the second magnetic tunnel junction element and provides the stored data to the image signal processor.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
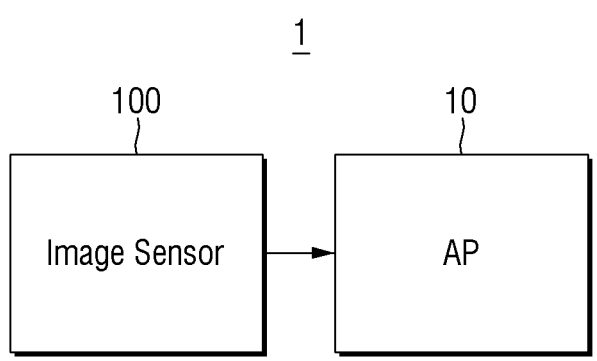
FIG. 1 is a block diagram of an image sensing device according to some embodiments.
Figure 2:
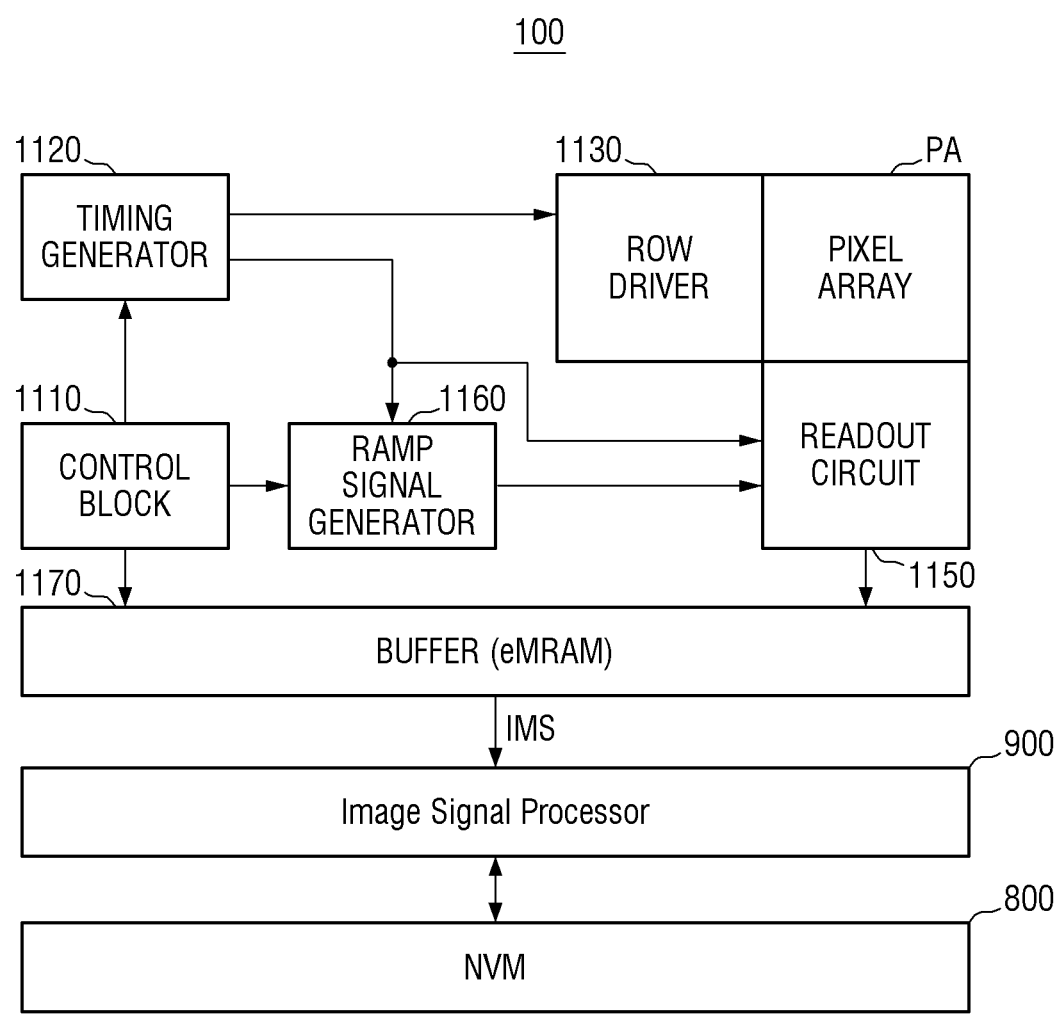
FIG. 2 is a block diagram of an image sensor of FIG. 1.

FIG. 1 is a block diagram of an image sensing device according to some embodiments. FIG. 2 is a block diagram of an image sensor of FIG. 1.

Referring to FIG. 1, an image sensing device 1 may include an image sensor 100 and an application processor 10. The application processor 10 may control the image sensor 100 and may receive an image signal from the image sensor 100.

The image sensor 100 may generate an image signal by sensing an image of a target object using light. In some embodiments, the image signal may be, e.g., a digital signal, but the present disclosure is not limited thereto.

The image signal may be provided to, and processed by, the application processor 10. The application processor 10 may receive the image signal from the image sensor 100 and may process the image signal so that the image signal may be suitable to be displayed.

In some embodiments, the application processor 10 may perform digital binning on the image signal output from the image sensor 100. The image signal output from the image sensor 100 may be a raw image signal from a pixel array PA that is yet to be subject to analog binning or an image signal that has already been subject to analog binning.

In some embodiments, the image sensor 100 and the application processor 10 may be separate. For example, the image sensor 100 may be mounted in a first chip, the application processor 10 may be mounted in a second chip, and the image sensor 100 and the application processor 10 may communicate with each other via a predetermined interface. However, the present disclosure is not limited to this example. Alternatively, the image sensor 100 and the application processor 10 may be incorporated into a single package, e.g., a multichip package (MCP).

Referring to FIG. 2, the image sensor 100 may include a control register block 1110, a timing generator 1120, a row driver 1130, the pixel array PA, a readout circuit 1150, a ramp signal generator 1160, a buffer 1170, an image signal processor 900 and a nonvolatile memory (NVM) device 800.

The control register block 1110 may generally control the operation of the image sensor 100. The control register block 1110 may transmit operation signals directly to the timing generator 1120, the ramp signal generator 1160, and the buffer 1170.

The timing generator 1120 may generate an operation timing reference signal that can be referenced for the operation of various elements of the image sensor 100. The operation timing reference signal may be transmitted to the row driver 1130, the readout circuit 1150, and the ramp signal generator 1160.

The ramp signal generator 1160 may generate and transmit ramp signals for use in the readout circuit 1150. For example, the readout circuit 1150 may include a correlated double sampler (CDS) and a comparator, and the ramp signal generator 1160 may generate and transmit ramp signals for use in the CDS and the comparator.

The buffer 1170 may include, e.g., a latch. The buffer 1170 may temporarily store the image signal and may transmit the image signal to an external memory or an external device. The buffer 1170 may include, e.g., an embedded magnetoresistive random-access memory (eMRAM), but the present disclosure is not limited thereto. Alternatively, the buffer 1170 may include a memory, e.g., a dynamic random-access memory (DRAM) or a static random-access memory (SRAM).

The pixel array PA may sense an external image. The pixel array PA may include a plurality of pixels (or unit pixels). The row driver 1130 may selectively activate each row of the pixel array PA.

The readout circuit 1150 may sample a pixel signal provided from the pixel array PA, may compare the pixel signal with a ramp signal and may convert an analog image signal (or data) into a digital image signal (or data) based on the result of the comparison.

Figure 3:
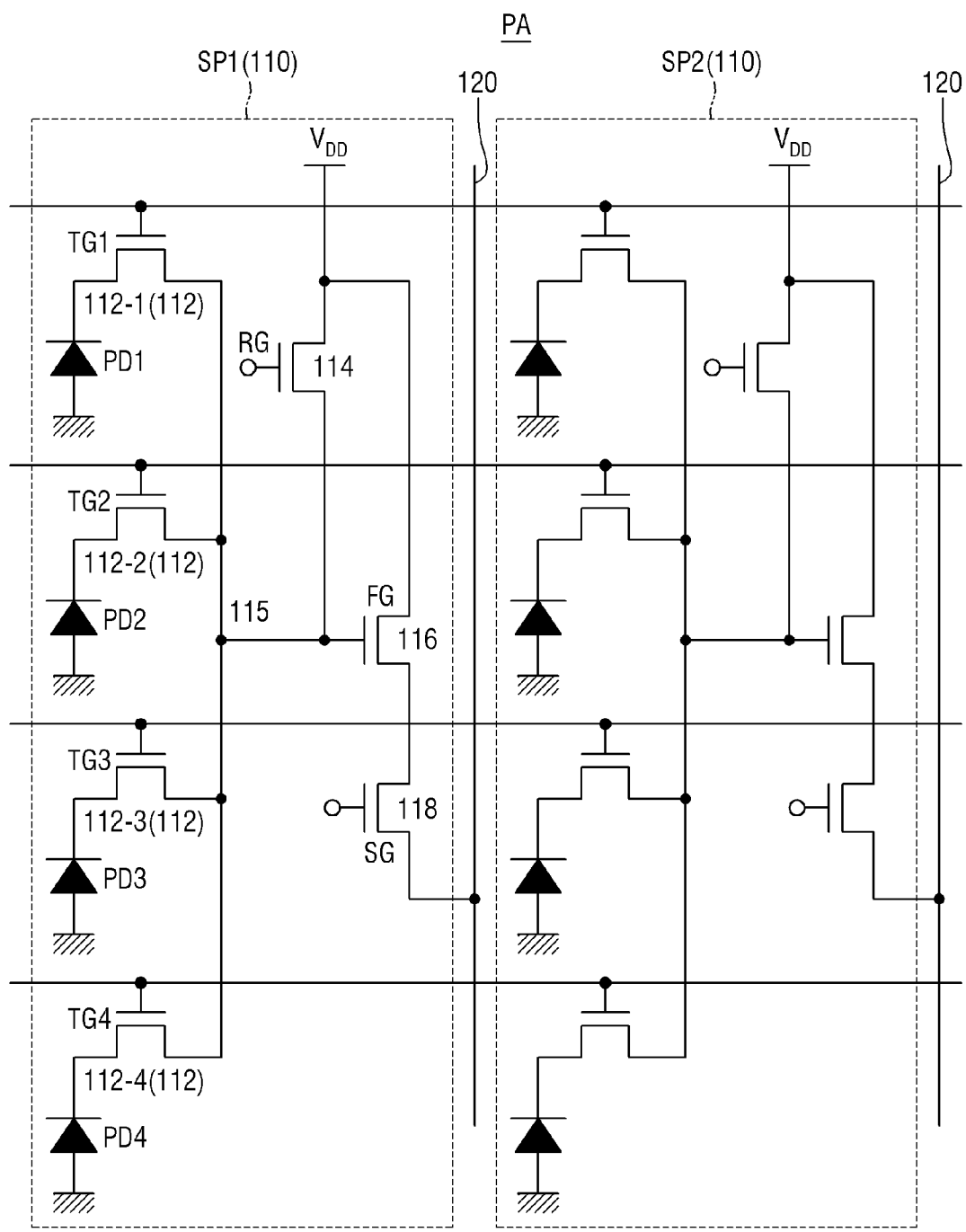
FIGS. 3 and 4 are a circuit diagram and a plan view, respectively, of a unit pixel of the pixel array of FIG. 2.
Figure 4:
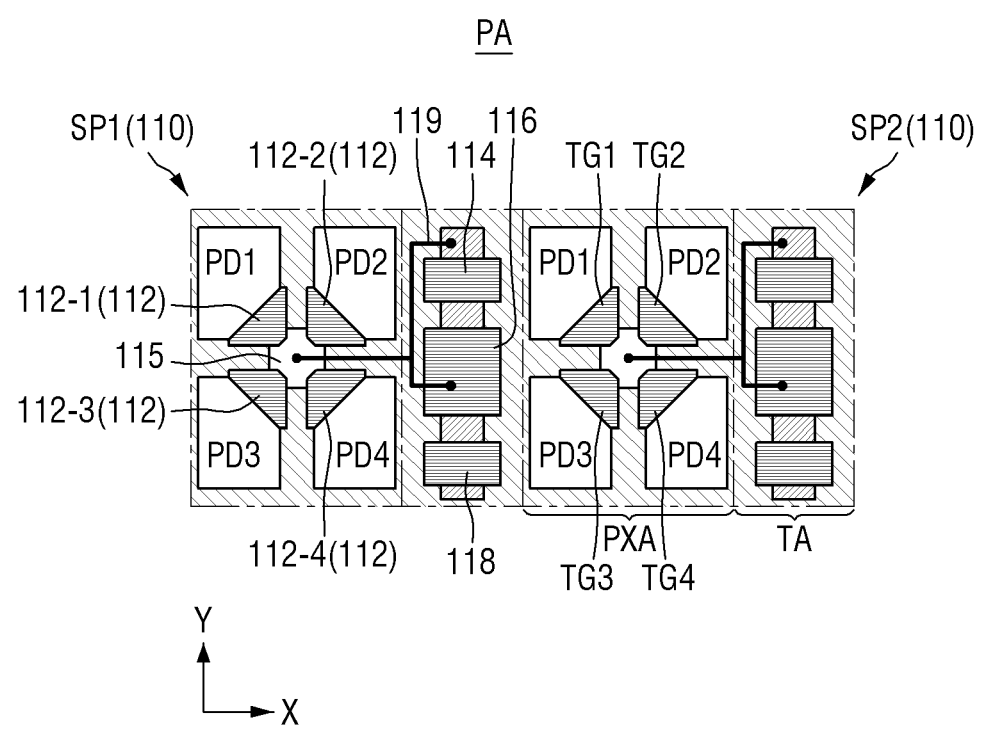

FIGS. 3 and 4 are a circuit diagram and a plan view, respectively, of a unit pixel of the pixel array PA of FIG. 2.

Referring to FIGS. 3 and 4, in the pixel array PA of the image sensor 100, 4-shared pixels 110 may be arranged two-dimensionally. FIG. 4 illustrates only two 4-shared pixels 110 that are adjacent to each other in a first direction X, i.e., first and second 4-shared pixels SP1 and SP2, but in the pixel array PA, multiple 4-shared pixels 110 may be arranged two-dimensionally in the first direction X and a second direction Y that intersects the first direction X.

In detail, in the image sensor 100, four pixels may be arranged in a pixel area PXA, and transistors (114, 116 and 118) may be arranged in a transistor area TA. The four pixels may form a single 4-shared pixel. The first 4-shared pixel SP1 may have a structure in which four photodiodes, i.e., first through fourth photodiodes PD1 through PD4, surround and share one floating diffusion region 115. Also, the second 4-shared pixel SP2 may have a structure in which four photodiodes, i.e., first through fourth photodiodes PD1 through PD4, share one floating diffusion region 115. In the image sensor 100, one photodiode may form one pixel.

In each of the 4-shared pixels 110, one floating diffusion region 115 may be shared by four photodiodes via transfer transistors 112 corresponding to the four photodiodes. In detail, a first transfer transistor 112-1 corresponding to a first photodiode PD1, a second transfer transistor 112-2 corresponding to a second photodiode PD2, a third transfer transistor 112-3 corresponding to a third photodiode PD3, and a fourth transfer transistor 112-4 corresponding to a fourth photodiode PD4 may share one floating diffusion region 115 as a common drain region.

In each of the 4-shared pixels 110, four photodiodes may share all the transistors except for transfer transistors 112. The four photodiodes, i.e., first through fourth photodiodes PD1 through PD4, may share a reset transistor 114, a source follower transistor 116, and a select transistor 118. The reset transistor 114, the source follower transistor 116, and the select transistor 118 may be arranged in the second direction Y in the transistor area TA.

Referring to FIGS. 3 and 4, four photodiodes, i.e., first through fourth photodiodes PD1 through PD4, may be connected to the source regions of four transfer transistors 112. The drain regions of the four transfer transistors 112 may be connected to the source region of the reset transistor 114. The common drain region of the transfer transistors 112 may correspond to the floating diffusion region 115. The floating diffusion region 115 may be connected to the gate electrode of the source follower transistor 116, i.e., a source follower gate electrode FG, and the source region of the reset transistor 114, via wires 119. A common point between the drain region of the reset transistor 114 and the drain region of the source follower transistor 116 may be connected to a power supply voltage VDD. The source region of the source follower transistor 116 and the drain region of a select transistor 118 may be shared, and a column signal line 120 may be connected to the source region of the select transistor 118. The voltage in the source region of the select transistor 118 may be output to the column signal line 120 as an output signal.

Each unit pixel of the pixel array PA may include four shared pixels and the plurality of transistors (114, 116 and 118) in the transistor area TA, and may also include as many transfer transistors 112 as there are shared photodiodes. However, the present disclosure is not limited to this. For example, each unit pixel of the pixel array PA may have a 2-shared pixel configuration including two pixels and pixel transistors corresponding to the two pixels or an 8-shared pixel configuration including eight pixels and pixel transistors corresponding to the eight transistors.

Figure 5:
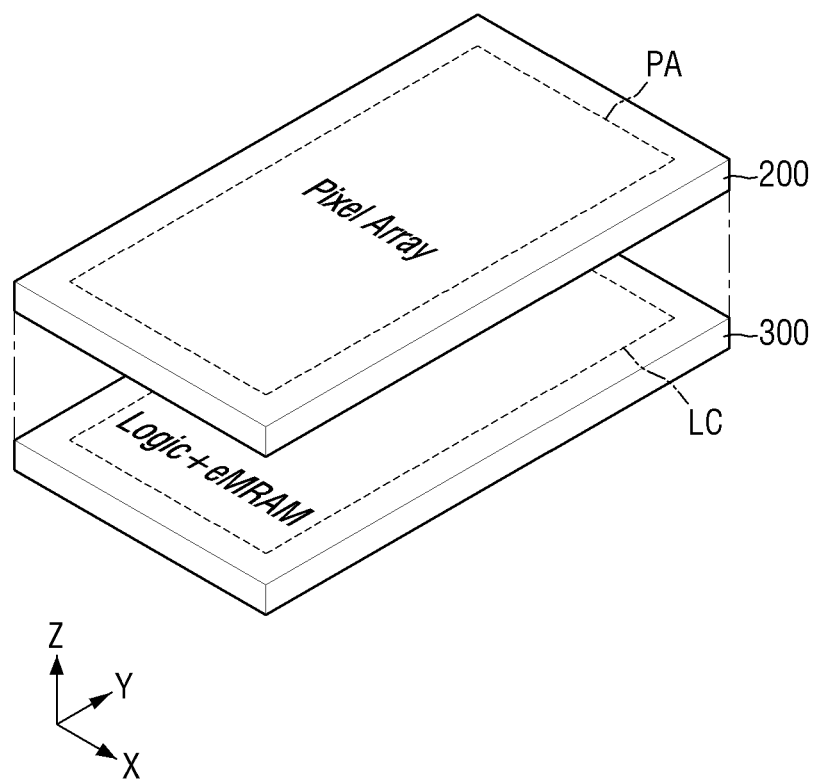
FIG. 5 is a layout view of an image sensor according to some embodiments.

FIG. 5 is a layout view of an image sensor according to some embodiments. Referring to FIG. 5, an image sensor 100a may include an upper chip 200 and a lower chip 300 that are stacked. In the upper chip 200, a plurality of pixels may be arranged in the form of a two-dimensional (2D) array. That is, the upper chip 200 may include the pixel array PA. The lower chip 300 may include a logic region LC and a memory region. The lower chip 300 may be disposed below the upper chip 200 and may be electrically connected to the upper chip 200. The lower chip 300 may allow pixel signals from the upper chip 200 to be delivered to the logic region LC of the lower chip 300.

Logic elements may be disposed in the logic region LC of the lower chip 300. The logic elements may include circuits for processing pixel signals from the pixels. For example, the logic elements may include the control register block 1110, the timing generator 1120, the row driver 1130, the readout circuit 1150, and the ramp signal generator 1160 of FIG. 2.

A magnetoresistive random-access memory (MRAM) may be disposed in the memory region of the lower chip 300. For example, a plurality of MRAM cells may be arranged in the form of a 2D array in the memory region. The MRAM cells may have a magnetic tunnel junction (MTJ) structure.

An eMRAM may be disposed in the memory region of the lower chip 300. For example, the buffer 1170 of FIG. 1 may include an eMRAM. The MRAM in the memory region may be formed as an eMRAM. For example, the logic elements in the logic region and the MRAM in the memory region may be formed together by a complementary metal-oxide semiconductor (CMOS) process.

The MRAM of the lower chip 300 may be used as an image buffer memory for storing a frame image. Thus, the image sensor 100a may temporarily store a frame image using the MRAM and may perform signal processing on the frame image, thereby minimizing a Jello effect, i.e., a rolling shutter, and improving the operating properties of the image sensor 100a. Also, as the MRAM of the image sensor 100a is formed in an embedded form together with the logic elements, the fabrication of the image sensor 100a can be simplified, and the size of the image sensor 100a can be reduced. That is, the yield of the image sensor 100a can be increased through the use of an eMRAM, and the manufacturing cost of the image sensor 100a can be reduced.

Figure 6:
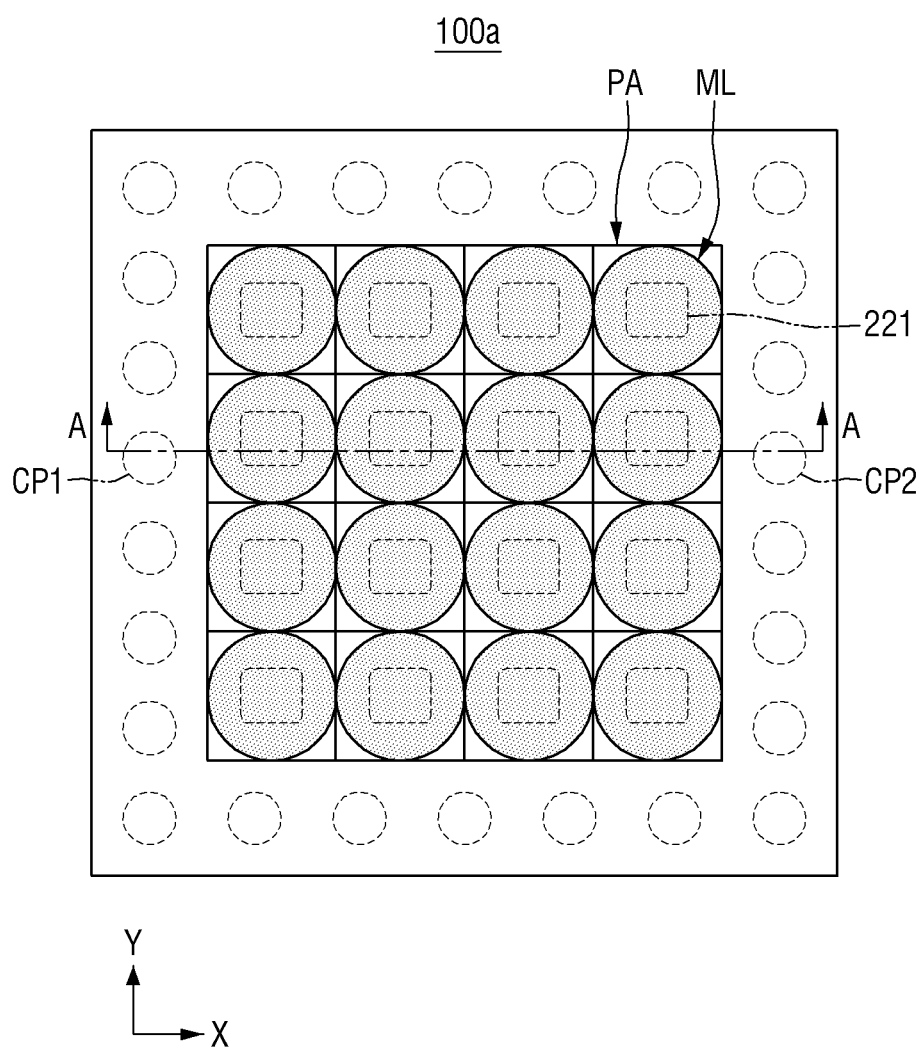
FIG. 6 is a top view of the image sensor of FIG. 5.
Figure 7:
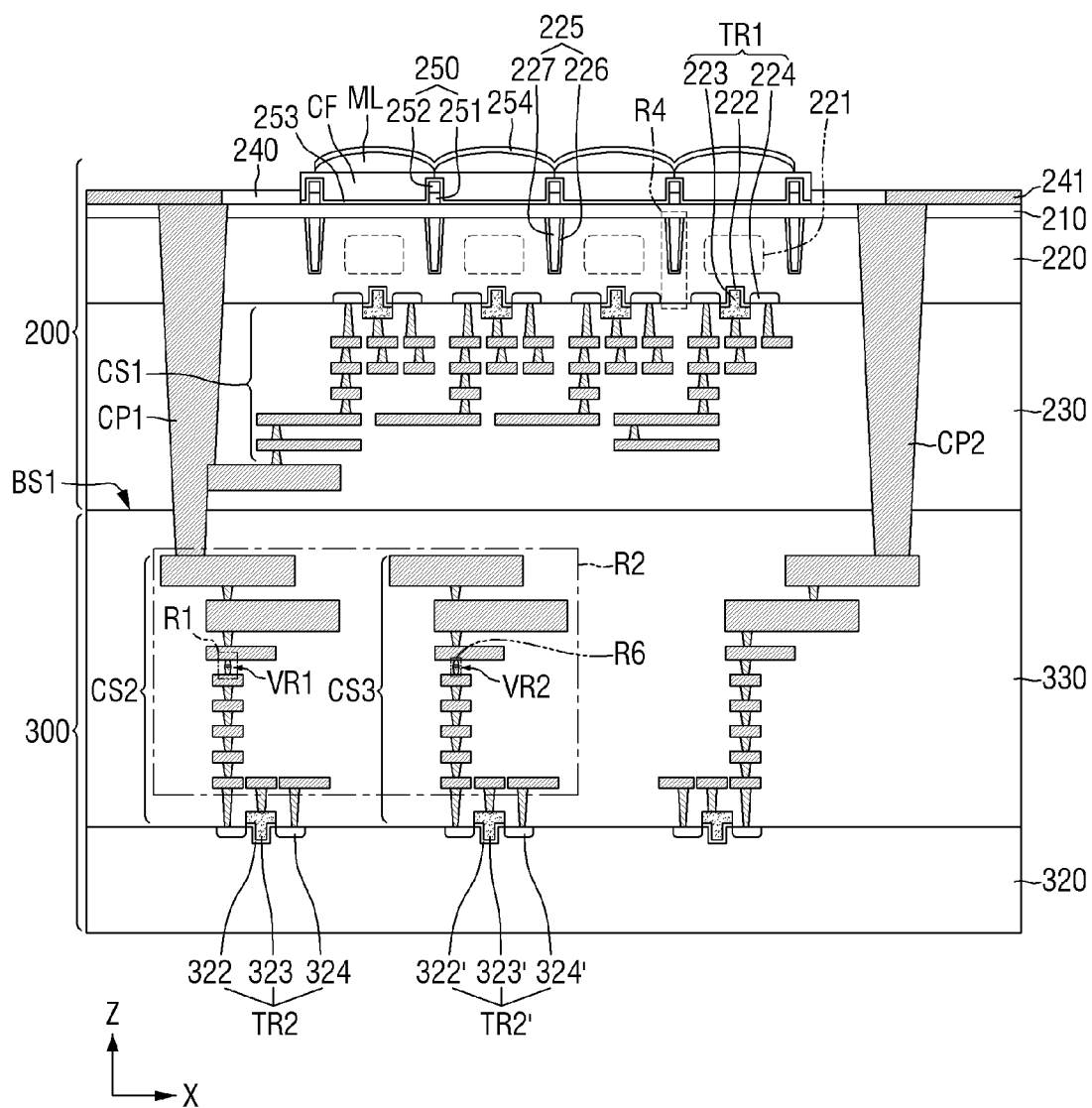
FIG. 7 is a cross-sectional view taken along line A-A of FIG. 6.

FIG. 6 is a top view of the image sensor of FIG. 5. FIG. 7 is a cross-sectional view taken along line A-A of FIG. 6.

Referring to FIG. 6, the pixel array PA of the upper chip 200 may be disposed on the top surface of the image sensor 100a. In detail, the pixel array PA may be disposed on the top surface of the upper chip 200 of the image sensor 100a, e.g., the pixel array PA may be centered on the top surface of the upper chip 200. First contact plugs CP1 and second contact plugs CP2, which connect the upper chip 200 and the lower chip 300, may be disposed outside a region where the pixel array PA is disposed, e.g., the first and second contact plugs CP1 and CP2 may surround an entire perimeter of the pixel array PA. Microlenses ML may be disposed in the region where the pixel array PA is disposed, e.g., the microlenses ML may be arranged in an array on the pixel array PA.

Referring to FIG. 7, the image sensor 100a may include the upper chip 200 and the lower chip 300 sequentially stacked. The upper chip 200 may include a semiconductor substrate 220, photoelectric conversion layers 221, first transistors TR1, and pixel separation patterns 225. The upper chip 200 may further include an inter-wire insulating layer 230 between the semiconductor substrate 220 and the lower chip 300.

In detail, the semiconductor substrate 220 may include, e.g., bulk silicon or silicon-on-insulator (SOI). The semiconductor substrate 220 may be a silicon substrate or may include a material other than silicon, e.g., silicon germanium, indium antimonide, a lead tellurium compound, indium arsenic, indium phosphide, gallium arsenide, or gallium antimonide. Alternatively, the semiconductor substrate 220 may be a base substrate having an epitaxial layer formed thereon. The semiconductor substrate 220 may have a front surface and a rear surface that are opposite to each other. In some embodiments, the rear surface of the semiconductor substrate 220 may be a light-receiving surface upon which light is incident.

In some embodiments, the first transistors TR1 may be disposed on the front surface of the semiconductor substrate 220. The first transistors TR1 may include various transistors, e.g., a transfer transistor, a reset transistor, a source follower transistor, a select transistor, etc., that form each unit pixel of the image sensor 100a.

The first transistors TR1 may include gate insulating films 222, gate electrodes 223, and impurity-injected areas 224. The gate insulating films 222 may be formed along trenches formed in the semiconductor substrate 220. The gate electrodes 223 may fill the spaces defined by the gate insulating films 222. The impurity-injected areas 224 may be formed by doping impurities into the semiconductor substrate 220. The gate electrodes 223 may serve as the gates of the first transistors TR1, and the impurity-injected areas 224 may serve as the sources/drains of the first transistors TR1.

The pixel separation patterns 225 may be disposed in the semiconductor substrate 220. The pixel separation patterns 225 may define a plurality of unit pixels. The unit pixels may be arranged two-dimensionally in a plan view. For example, the pixel separation patterns 225 may be formed in a lattice shape in a plan view to separate the unit pixels from one another. The pixel separation patterns 225 may be formed by burying deep trenches formed in the semiconductor substrate 220 through patterning with an insulating material.

In some embodiments, each of the pixel separation patterns 225 may include an insulating spacer film 226 and a conductive filling pattern 227. The insulating spacer film 226 may extend conformally along the side surfaces of a trench in the semiconductor substrate 220. The conductive filling pattern 227 may be formed on the insulating spacer film 226 to fill part of the trench in the semiconductor substrate 220.

The unit pixels may include the photoelectric conversion layers 221. The photoelectric conversion layers 221 may be formed in the semiconductor substrate 220. The photoelectric conversion layers 221 may generate electric charge in proportion to the amount of light incident from the outside. The photoelectric conversion layers 221 may be formed by doping impurities in the semiconductor substrate 220. For example, in a case where the semiconductor substrate 220 is doped with p-type impurities, the photoelectric conversion layers 221 may be doped with n-type impurities.

The upper chip 200 may further include a surface insulating layer 210, a passivation layer 240, grid patterns 250, a first liner 253, color filters CF, the microlenses ML, and a second liner 254.

The surface insulating layer 210 may be deposited on the rear surface of the semiconductor substrate 220. The passivation layer 240 may be deposited on the surface insulating layer 210. The grid patterns 250, the first liner 253, the color filters CF, the microlenses ML, and the second liner 254 may be disposed in a region defined by the surface insulating layer 210.

The color filters CF may be formed on the surface insulating layer 210. The color filters CF may be arranged to correspond to the unit pixels, e.g., in a one-to-one correspondence. The color filters CF may be arranged two-dimensionally in a plan view. The microlenses ML may be formed on the color filters CF. The microlenses ML may be arranged to correspond to the unit pixels, e.g., in a one-to-one correspondence. The microlenses ML may have a convex shape with a predetermined radius of curvature. Accordingly, the microlenses ML can condense light incident upon the photoelectric conversion layers 221. The microlenses ML may include, e.g., a light-transmitting resin, but the present disclosure is not limited thereto.

The grid patterns 250 may be formed between, e.g., adjacent ones of, the color filters CF. The grid patterns 250 may be formed on the surface insulating layer 210. The grid patterns 250 may include, e.g., metal patterns 251 and low refractive index patterns 252. The metal patterns 251 and the low refractive index patterns 252 may be sequentially stacked on the surface insulating layer 210.

The first liner 253 may be formed on the surface insulating layer 210 and on the grid patterns 250. The first liner 253 may extend along the surfaces of the surface insulating layer 210 and the grid patterns 250. The first liner 253 may include, e.g., aluminum oxide, but the present disclosure is not limited thereto.

The second liner 254 may extend along the surfaces of the microlenses ML. The second liner 254 may include, e.g., an inorganic oxide film (e.g., silicon oxide, titanium oxide, zirconium oxide, hafnium oxide, or a combination thereof), but the present disclosure is not limited thereto.

The upper chip 200 may include the inter-wire insulating layer 230 and a first connecting structure CS1. The first connecting structure CS1 may be formed in the inter-wire insulating layer 230. The first connecting structure CS1 may include a plurality of metal layers and a plurality of contacts that connect the metal layers.

The first connecting structure CS1 may be connected to the first transistors TR1. The first connecting structure CS1 may deliver electrical signals transmitted from the first transistors TR1. The first connecting structure CS1 may include a conductive material, e.g., a metallic material such as copper or lead.

The lower chip 300 may be disposed below the upper chip 200. That is, the lower chip 300 and the upper chip 200 may be in contact with each other at a first bonding surface BS1. The upper chip 200 and the lower chip 300 may be connected by first and second contact plugs CP1 and CP2 that will be described later.

The lower chip 300 may include a semiconductor substrate 320, second transistors TR2 and TR2', an inter-wire insulating layer 330, a first variable resistance element VR1, a second variable resistance element VR2, a second connecting structure CS2, and a third connecting structure CS3. The second and third connecting structures CS2 and CS3 may be formed in the inter-wire insulating layer 330.

The semiconductor substrate 320 may include, e.g., bulk silicon or SOI. The semiconductor substrate 320 may be a silicon substrate or may include a material other than silicon, such as, e.g., silicon germanium, indium antimonide, a lead tellurium compound, indium arsenic, indium phosphide, gallium arsenide, or gallium antimonide.

The second transistors TR2 and TR2' may be disposed on the front surface of the semiconductor substrate 320. The second transistors TR2 and TR2' may be implemented as logic elements, e.g., the control register block 1110, the timing generator 1120, the row driver 1130, the readout circuit 1150, and the ramp signal generator 1160 of the image sensor 100 of FIG. 2. The second transistors TR2 and TR2' may include gate insulating films 322 and 322', respectively, gate electrodes 323 and 323', respectively, and impurity-injected regions 324 and 324', respectively. The second transistors TR2 and TR2', the first contact plug CP1, and the second contact plug CP2 may be connected by the second and third connecting structures CS2 and CS3 of the lower chip 300.

Figure 13:
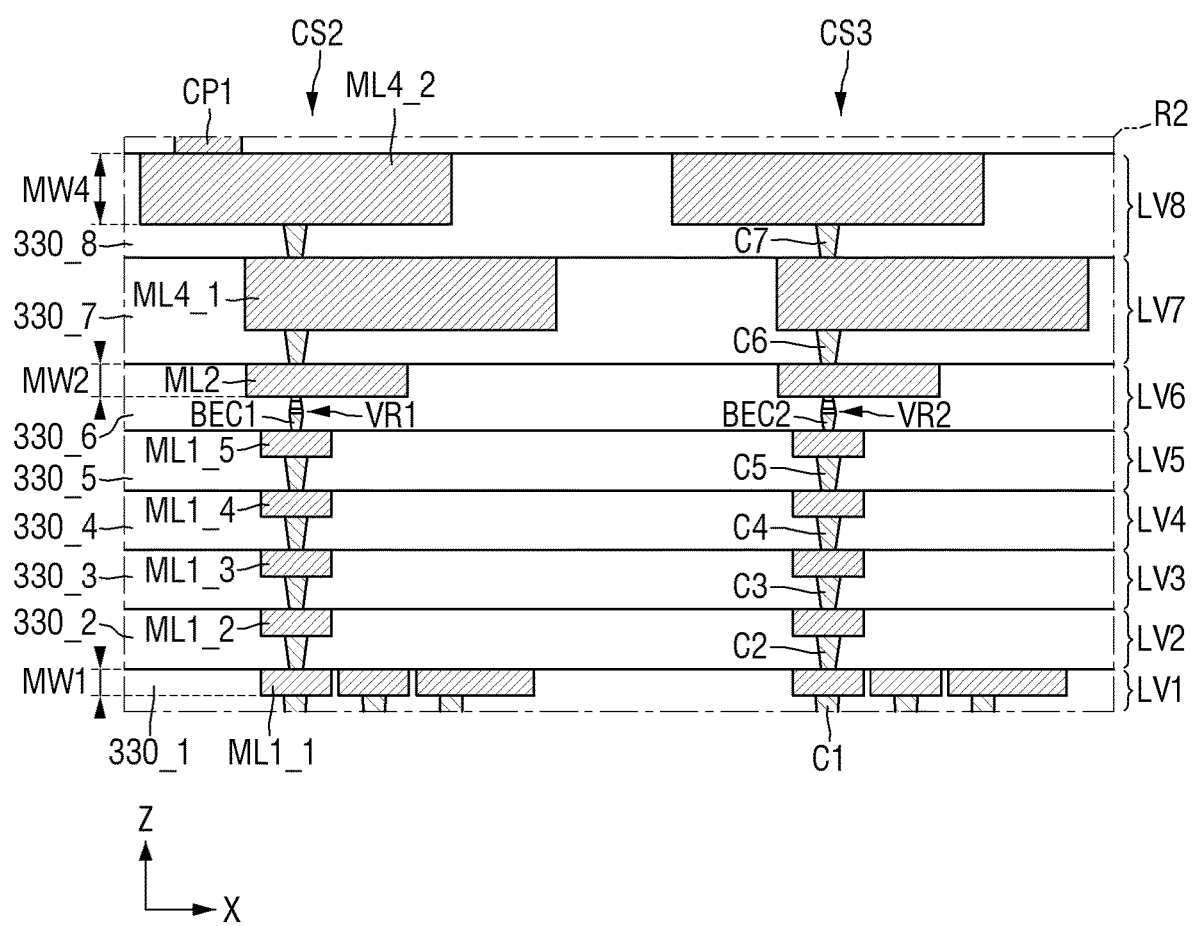
FIG. 13 is an enlarged cross-sectional view of a region R2 of FIG. 7.

FIG. 13 is an enlarged cross-sectional view of region R2 of FIG. 7. Referring to FIGS. 7 and 13, first metal layers (ML1_1 through ML1_5) may be formed in the inter-wire insulating layer 330. The first metal layers (ML1_1 through ML1_5) may be sequentially arranged from the surface where the second transistor TR2 is located.

The first metal layers (ML1_1 through ML1_5) may have the same thickness, e.g., in the Z direction. The first metal layers (ML1_1 through ML1_5), second metals layer ML2, and fourth metal layers (ML4_1 and ML4_2) may have different thicknesses. For example, the thickness of the second metal layer ML2 may be greater than the thickness of the first metal layers (ML1_1 through ML1_5), e.g., along the Z direction. For example, the thickness of the fourth metal layers (ML4_1 and ML4_2) may be greater than the thickness of the second metal layers ML2, e.g., along the Z direction.

The first metal layers (ML1_1 through ML1_5), the second metal layers ML2, and the fourth metal layers (ML4_1 and ML4_2) may be connected by a plurality of contacts (C1 through C7). For example, a plurality of contacts (C1 through C5) may connect the first metal layers (ML1_1 through ML1_5). For example, a plurality of contacts (C6 and C7) may connect the second metal layers ML2 and the fourth metal layers (ML4_1 and ML4_2).

In detail, one of the first metal layers ML1_5 and one of the second metal layers ML2 may be connected by a first contact BEC1 and a first variable resistance element VR1. Another of the first metal layers ML1_5 and another of the second metal layers ML2 may be connected by a second contact BEC2 and a second variable resistance element VR2. The first contact BEC1 and the first variable resistance element VR1 may be spaced apart from the second contact BEC2 and the second variable resistance element VR2 in the first direction X. That is, the first contact BEC1, the first variable resistance element VR1, the second contact BEC2, and the second variable resistance element VR2 may be disposed between the first metal layers ML1_5 and the second metal layers ML2, while the other metal layers are connected by the contacts (C1 through C7).

Figure 8:
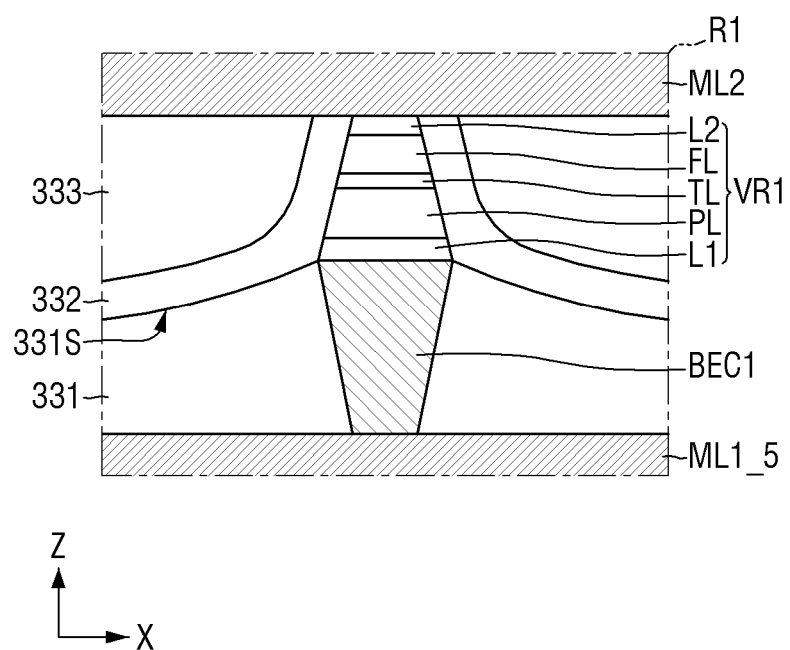
FIG. 8 is an enlarged cross-sectional view of region R1 of FIG. 7.

FIG. 8 is an enlarged cross-sectional view of region R1 of FIG. 7. It is noted that region R1 corresponds to the first contact BEC1 and the first variable resistance element VR1.

Referring to FIG. 8, the first contact BEC1 and the first variable resistance element VR1 may be disposed between the first metal layer ML1_5 and the second metal layer ML2. That is, the first contact BEC1 and the first variable resistance element VR1 may directly connect the first metal layer ML1_5 and the second metal layer ML2.

The first contact BEC1 may be disposed on the first metal layer ML1_5 and may be connected to the first metal layer ML1_5. The first contact BEC1 may have a shape that is narrower at the bottom thereof than at the top thereof, but the present disclosure is not limited thereto. The first variable resistance element VR1 may be formed on the first contact BEC1. The first variable resistance element VR1 may connect the first contact BEC1 and the second metal layer ML2.

The inter-wire insulating layer 330 may include a plurality of layers. For example, the inter-wire insulating layer 330 may include a first insulating layer 331, a capping film 332, and a second insulating layer 333. The first insulating layer 331 may be formed on the first metal layer ML1_5. The first insulating layer 331 may be formed to surround the first contact BEC1. That is, the first insulating layer 331 may be formed along the sidewalls of the first contact BEC1 and the top surface of the first metal layer ML1_5. A top surface 331S of the first insulating layer 331 may be downwardly recessed.

The capping film 332 may be formed along the top surface 331S of the first insulating layer 331 and the sidewalls of the first variable resistance element VR1. That is, the capping film 332 may be formed to surround the first variable resistance element VR1. The capping film 332 may protect the first variable resistance element VR1 from the outside. The capping film 332 may be formed along the top surface 331S of the first insulating layer 331 to be downwardly recessed.

The second insulating layer 333 may be formed on the capping film 332. That is, the second insulating layer 333 may be formed between the capping film 332 and the second metal layer ML2.

The first variable resistance element VR1 may be an MTJ device. In this case, the first variable resistance element VR1 may be a nonvolatile memory device. Data may be temporarily stored in or may be read out from the first variable resistance element VR1.

The first variable resistance element VR1 may include a first layer L1, a fixed layer PL, a tunnel layer TL, a free layer FL and a second layer L2. The first layer L1, the fixed layer PL, the tunnel layer TL, the free layer FL, and the second layer L2 may be sequentially deposited.

The first layer L1 may be formed on the first contact BEC1. The first layer L1 may include a metal nitride, e.g., tantalum nitride, titanium nitride, or tungsten nitride.

The fixed layer PL may be formed on the first layer L1. The fixed layer PL may include, e.g., iron manganese (FeMn), iridium manganese (IrMn), platinum manganese (PtMn), manganese oxide (MnO), manganese sulfide (MnS), manganese tellurium (MnTe), manganese fluoride ($MnF_2$), iron fluoride ($FeF_2$), iron chloride ($FeCl_2$), iron oxide (FeO), cobalt chloride ($CoCl_2$), cobalt oxide (CoO), nickel chloride ($NiCl_2$), nickel oxide (NiO), or chromium (Cr).

The tunnel layer TL may be formed on the fixed layer PL. The tunnel layer TL may include, e.g., aluminum oxide or magnesium oxide.

The free layer FL may be formed on the tunnel layer TL. The free layer FL may include, e.g., a ferromagnetic material including at least one of iron (Fe), nickel (Ni) and cobalt (Co).

The second layer L2 may be formed on the free layer FL. The second layer L2 may include a metal, e.g., tantalum, titanium, or tungsten, or a metal nitride, e.g., titanium nitride or tantalum nitride.

Figure 9:
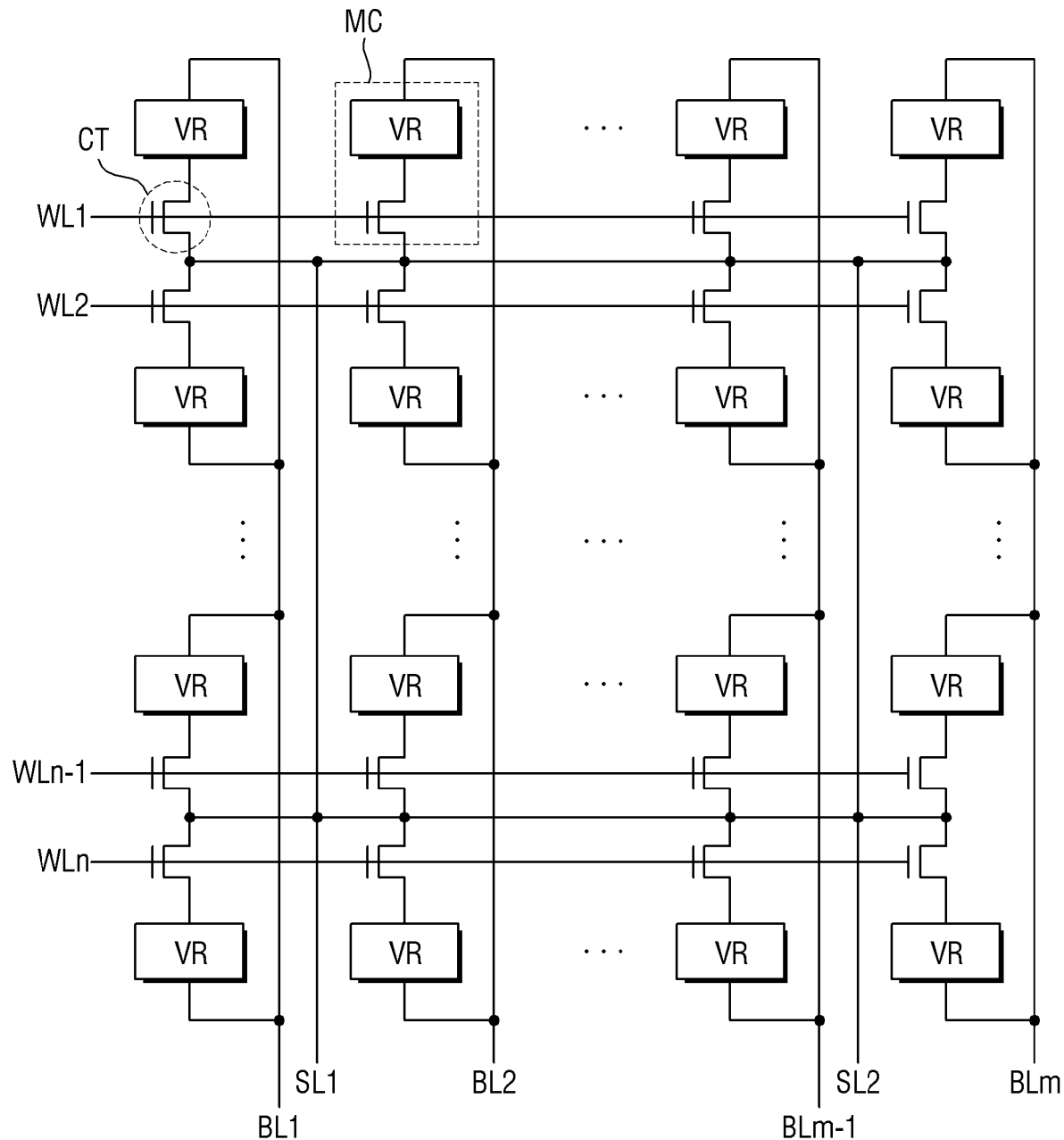
FIG. 9 is a circuit diagram of a memory cell array according to some embodiments.
Figure 10:
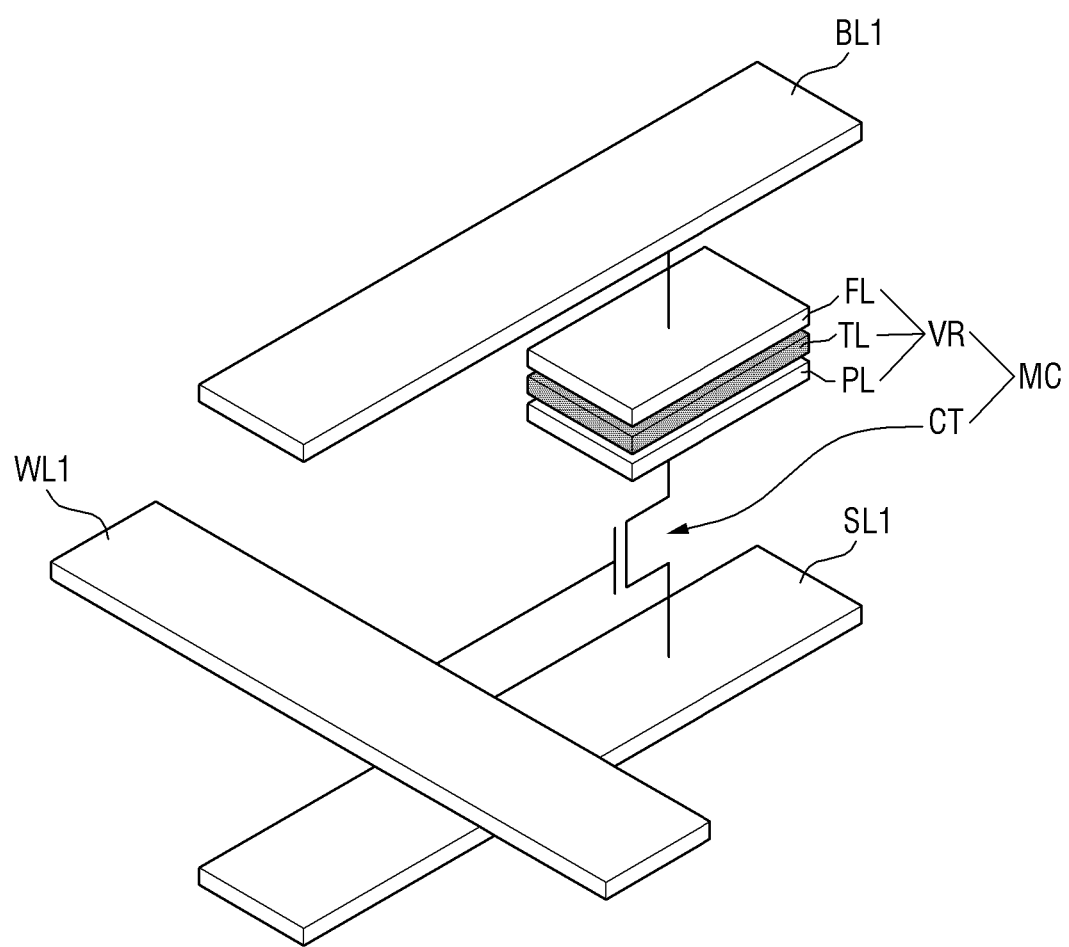
FIGS. 10 and 11 are perspective views of a memory cell of the memory cell array of FIG. 9.
Figure 11:
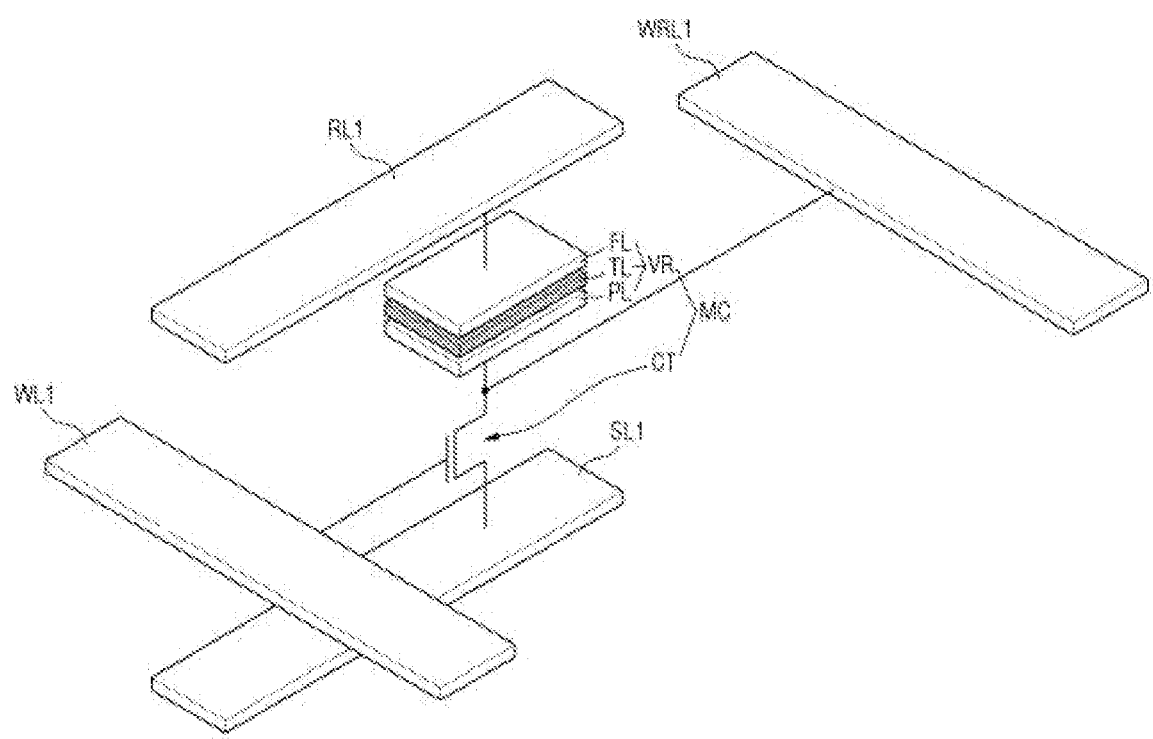
Figure 12:
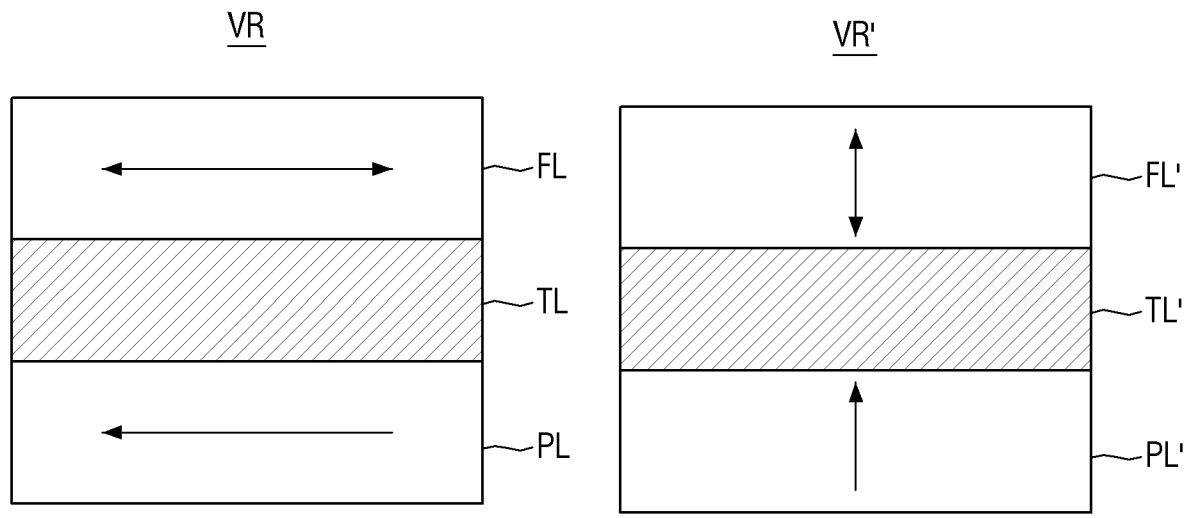
FIG. 12 illustrates cross-sectional views of variable resistance elements according to some embodiments.

FIG. 9 is a circuit diagram of a memory cell array according to some embodiments. FIGS. 10 and 11 are perspective views of a memory cell of the memory cell array of FIG. 9. FIG. 12 illustrates cross-sectional views of variable resistance elements according to some embodiments.

Referring to FIGS. 9 and 10, the memory cell array may include a plurality of memory cells MC. The memory cells MC may be arranged in row and column directions. The memory cells MC may include, e.g., variable resistance elements VR and cell transistors CT. Each of the variable resistance elements VR may be the first or second variable resistance element VR1 or VR2 in FIG. 7.

The gates of the cell transistors CT may be connected to first through n-th wordlines WL1 through WLn. The gates of cell transistors CT in one row may be connected in common to one wordline (e.g., the first wordline WL1), and the gates of cell transistors CT in another row may be connected in common to another wordline.

First ends of the cell transistors CT may be connected to first ends of the variable resistance elements VR. Second ends of the cell transistors CT may be connected to source lines (e.g., first and second source lines SL1 and SL2). The second ends of a pair of adjacent cell transistors CT may be connected in common to one source line (e.g., the first source line SL1).

The first ends and second ends of the variable resistance elements VR may be connected to first through m-th bitlines BL1 through BLm. The second ends of variable resistance elements VR in one column may be connected in common to one bitline (e.g., the first bitline BL1).

The variable resistance elements VR may have either a low-resistance state or a high-resistance state depending on bias conditions. By controlling the variable resistance elements VR to be in one of the low- and high-resistance states, data can be stored in the variable resistance elements VR. The memory cell array of FIG. 10 may be a spin-transfer torque magnetoresistive random-access memory (STT MRAM).

Referring to FIG. 11, one end of a cell transistor CT may be connected to a write line WRL1. One end of a variable resistance element VR may be connected to the write line WRL1. The other end of the variable resistance element VR may be connected to a read line RL1. The memory cell array of FIG. 11 may be a spin-orbit torque magnetoresistive random-access memory (SOT MRAM).

Referring again to FIG. 10, the variable resistance element VR may include the free layer FL, the fixed layer PL, and the tunnel layer TL. For example, the free layer FL, the fixed layer PL, and the tunnel layer TL may be disposed between the first bitline BL1 and the cell transistor CT. The tunnel layer TL may be disposed between the free layer FL and the fixed layer PL. The first bitline BL1 may correspond to the second metal layer ML2, the first wordline WL1 may correspond to a first metal layer ML1_1, and the first source line SL1 may correspond to another first metal layer ML1_1.

Referring to FIG. 12, the magnetization direction of the fixed layer PL of the variable resistance element VR may be fixed. The magnetization direction of the free layer FL of the variable resistance element VR may coincide with, or become opposite to, the magnetization direction of the fixed layer PL depending on bias conditions.

If the magnetization direction of the free layer FL is parallel to (or coincides with) the magnetization direction of the fixed layer PL, the resistance of the variable resistance element VR may be reduced. If the magnetization direction of the free layer FL is anti-parallel to the magnetization direction of the fixed layer PL, the resistance of the variable resistance element VR may be increased.

For example, if a current flows from the free layer FL to the fixed layer PL, electrons may move from the fixed layer PL to the free layer FL. The electrons that flow in the fixed layer PL may rotate in accordance with the magnetization direction of the fixed layer PL. Due to the electrons flowing in accordance with the magnetization direction of the fixed layer PL, the free layer FL may be magnetized. For example, the free layer FL may be magnetized in the same direction as the magnetization direction of the fixed layer PL.

For example, if a current flows from the fixed layer PL to the free layer FL, electrons may move from the free layer FL to the fixed layer PL. Some of the electrons injected into the fixed layer PL may be reflected from the fixed layer PL to the free layer FL and may rotate due to the magnetization direction of the fixed layer PL. The reflected electrons may rotate in a direction opposite to the magnetization direction of the fixed layer PL. Due to the rotation of the electrons, the free layer FL may be magnetized. That is, the free layer FL may be magnetized in the direction opposite to the magnetization direction of the fixed layer PL.

A variable resistance element VR' may include a fixed layer PL', a free layer FL', and a tunnel layer TL'. The variable resistance element VR', unlike the variable resistance element VR, may have a vertical magnetization direction.

Referring again to FIG. 7, the first and second contact plugs CP1 and CP2 may connect the upper chip 200 and the lower chip 300.

The first contact plug CP1 may extend from the top surface of the semiconductor substrate 220. The first contact plug CP1 may extend to the second connecting structure CS2 of the lower chip 300. Also, the first contact plug CP1 may be, e.g., electrically, connected to the first connecting structure CS1 of the upper chip 200. The first contact plug CP1 may be formed by filling a trench formed in an edge area of the upper chip 200 or the lower chip 300 with a conductive material and may, e.g., electrically, connect the upper chip 200 and the lower chip 300. Also, the first contact plug CP1 may fix, e.g., physically attach to prevent movement, the upper chip 200 and the lower chip 300.

A pad 241 may be formed on the first contact plug CP1. The pad 241 may be connected to the first contact plug CP1 and may transmit signals to, or receive signals from, the first contact plug CP1, e.g., the first contact plug CP1 may extend vertically along the Z direction between the pad 241 and the second connecting structure CS2.

The second contact plug CP2 may extend from the top surface of the semiconductor substrate 220. The second contact plug CP2 may extend to the second connecting structure CS2 of the lower chip 300. The second contact plug CP2 may be spaced apart from the first contact plug CP1. The second contact plug CP2 may be formed by filling a trench on an edge of the upper chip 200 and the lower chip 300 with a conductive material and may electrically, connect the upper chip 200 and the lower chip 300. Also, the second contact plug CP2 may fix the upper chip 200 and the lower chip 300.

The pad 241 may be formed on the second contact plug CP2. The pad 241 may be connected to the second contact plug CP2 and may transmit signals to, or receive signals from, the second contact plug CP2.

Referring to FIG. 6, the first contact plugs CP1 and the second contact plugs CP2 may be disposed in an edge area of the image sensor 100a. That is, the first contact plugs CP1 and the second contact plugs CP2 may be disposed on the outside of the region where the pixel array PA is disposed, but the present disclosure is not limited thereto.

Referring to FIG. 13, the inter-wire insulating layer 330 may include first through eighth sub-insulating layers 330_1 through 330_8. The first through eighth sub-insulating layers 330_1 through 330_8 may be sequentially stacked.

The first metal layers (ML1_1 through ML1_5), the second metal layers ML2, and the fourth metal layers (ML4_1 and ML4_2) may be sequentially stacked. The first metal layers (ML1_1 through ML1_5), the second metal layers ML2, and the fourth metal layers (ML4_1 and ML4_2) may be disposed in the first through eighth sub-insulating layers 330_1 through 330_8. For example, the first metal layers (ML1_1 through ML1_5) may be disposed, e.g., respectively, in the first through fifth sub-insulating layers 330_1 through 330_5, the second metal layers ML2 may be disposed in the sixth sub-insulating layer 330_6, and the fourth metal layers (ML4_1 and ML4_2) may be disposed in the seventh and eighth sub-insulating layers 330_7 and 330_8.

The first metal layers (ML1_1 through ML1_5) may have a first thickness MW1. The second metal layers ML2 may have a second thickness MW2. The fourth metal layers (ML4_1 and ML4_2) may have a fourth thickness MW4. The second thickness MW2 may be greater than the first thickness MW1, and the third thickness MW3 may be greater than the second thickness MW2.

The contacts (C1 through C7) may be disposed in the inter-wire insulating layer 330. For example, the contacts (C1 through C5) may be disposed in the first through fifth sub-insulating layers 330_1 through 330_5, and the contacts (C6 and C7) may be disposed in the seventh and eighth sub-insulating layers 330_7 and 330_8. The contacts (C1 through C7) may connect the first metal layers (ML1_1 through ML1_5), the second metal layers ML2 and the fourth metal layers (ML4_1 and ML4_2).

The first through eighth sub-insulating layers 330_1 through 330_8 may correspond to first through eighth metal levels LV1 through LV8. For example, the first metal level LV1 may include the first sub-insulating layer 330_1, first metal layers ML1_1, and contacts C1. In another example, the eighth metal level LV8 may include the eighth sub-insulating layer 330_8, fourth metal layers ML4_2, and contacts C7. The first through eighth metal levels LV1 through LV8 may be sequentially stacked.

The second connecting structure CS2 may include the first metal layers (ML1_1 through ML1_5), a second metal layer ML2, the fourth metal layers ML4_1 and ML4_2, first contacts C1, and second through seventh contacts C2 through C7. The third connecting structure CS3 may also include the first metal layers (ML1_1 through ML1_5), the second metal layer ML2, the fourth metal layers ML4_1 and ML4_2, the first contacts C1, and the second through seventh contacts C2 through C7. The second and third connecting structures CS2 and CS3 may be spaced apart from each other in the first direction X.

The first variable resistance element VR1 may be connected to the second connecting structure CS2, and the second variable resistance element VR2 may be connected to the third connecting structure CS3. For example, the first variable resistance element VR1 may be disposed between the first metal layer ML1_5 and the second metal layer ML2 of the second connecting structure CS2, and the second variable resistance element VR2 may be disposed between the first metal layer ML1_5 and the second metal layer ML2 of the third connecting structure CS3.

Figure 14:
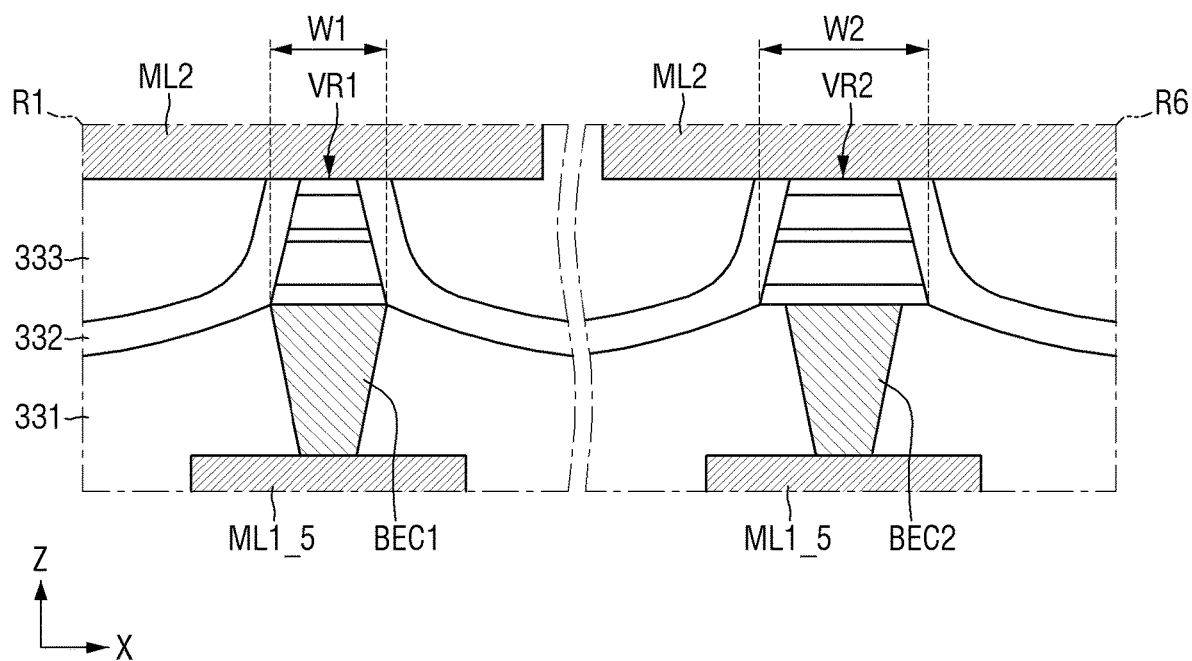
FIG. 14 is an enlarged cross-sectional view of regions R1 and R6 of FIG. 7.

FIG. 14 is an enlarged cross-sectional view of regions R1 and R6 of FIG. 7.

Referring to FIG. 14, the first variable resistance element VR1 may be disposed on the first contact BEC1, and the second variable resistance element VR2 may be disposed on the second contact BEC2. The width, in the first direction X, of the first variable resistance element VR1 may be a first width W1, and the width, in the first direction X, of the second variable resistance element VR2 may be a second width W2. As the first width W1 is smaller than the second width W2, the first variable resistance element VR1 may have a faster data processing speed than the second variable resistance element VR2.

Figure 15:
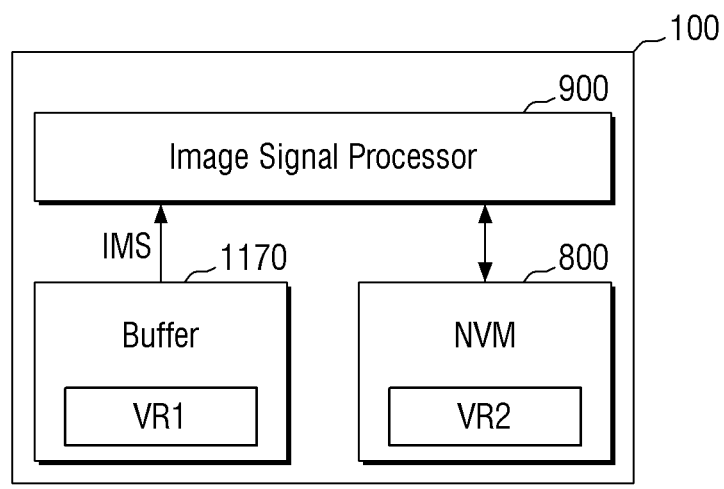
FIG. 15 is a block diagram of an image sensor according to some embodiments.

FIG. 15 is a block diagram of an image sensor according to some embodiments. Referring to FIG. 15, the buffer 1170 may include the first variable resistance element VR1, and the nonvolatile memory device 800 may include the second variable resistance element VR2. The buffer 1170, which includes the first variable resistance element VR1, may temporarily store signals transmitted by the pixel array PA and may provide the stored signals to the image signal processor 900. The nonvolatile memory device 800, which includes the second variable resistance element VR2, may store correction data and calibration data in the image signal processor 900. As the first and second variable resistance elements VR1 and VR2 have different properties, the buffer 1170 may have different properties from the nonvolatile memory device 800.

For example, the operating speed of the buffer 1170, which includes the first variable resistance element VR1, may be faster than the operating speed of the nonvolatile memory device 800, which includes the second variable resistance element VR2. For example, the buffer 1170, which includes the first variable resistance element VR1, may have a larger storage capacity than the nonvolatile memory device 800, which includes the second variable resistance element VR2. However, the present disclosure is not limited to these examples. That is, as the first and second variable resistance elements VR1 and VR2 having different properties are provided as eMRAMs, the first and second variable resistance elements VR1 and VR2 can enable the buffer 1170 and the nonvolatile memory device 800 to operate at the same time.

The image signal processor 900 may perform image processing on an image signal IMS provided by the buffer 1170, using data provided by the nonvolatile memory device 800. That is, the image signal processor 900 may generate a corrected image signal based on the data provided by the nonvolatile memory device 800 and the image signal IMS provided by the buffer 1170.

FIGS. 16 through 19 are cross-sectional views illustrating stages in a method of fabricating a variable resistance element according to some embodiments. FIGS. 16 through 19 correspond to the cross-sections in FIG. 14.

Figure 16:
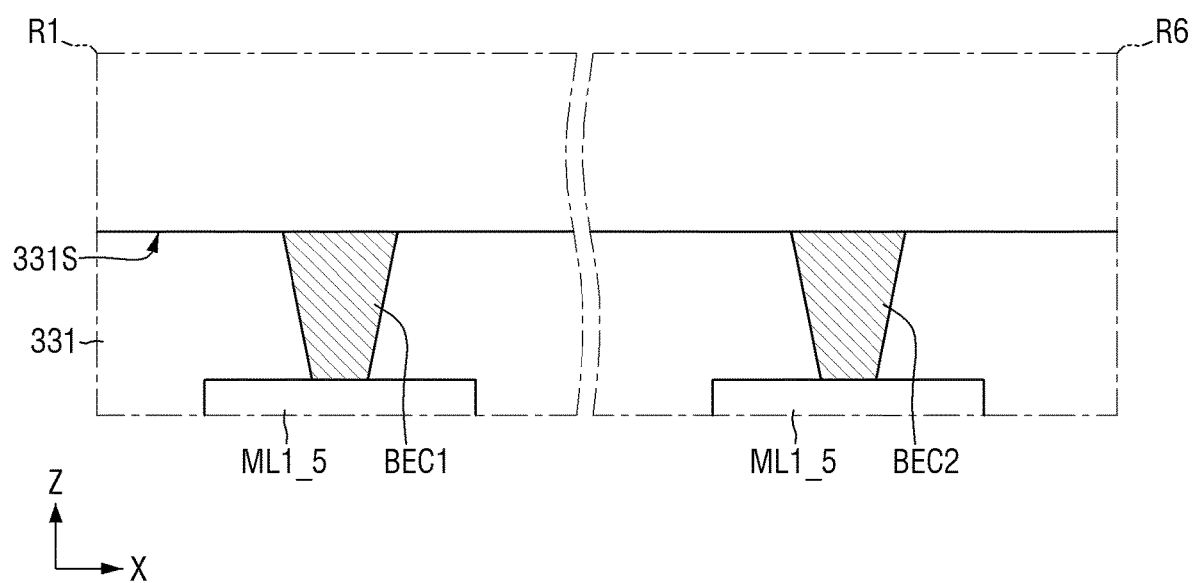
FIGS. 16 through 19 are cross-sectional views of stages in a method of fabricating a variable resistance element according to some embodiments.

Referring to FIG. 16, the first metal layers ML1_5 and the first and second contacts BEC1 and BEC2 may be formed in the first insulating layer 331. The first and second contacts BEC1 and BEC2 may be formed by forming, e.g., simultaneously etching, trenches through the first insulating layer 331 and filling the trenches with a conductive material.

A top surface 331S of the first insulating layer 331 may be flat. That is, the top surface 331S of the first insulating layer 331 may be placed on the same plane as the exposed top surfaces of the first and second contacts BEC1 and BEC2, e.g., the top surface 331S of the first insulating layer 331 and the exposed top surfaces of the first and second contacts BEC1 and BEC2 may be level with each other.

Figure 17:
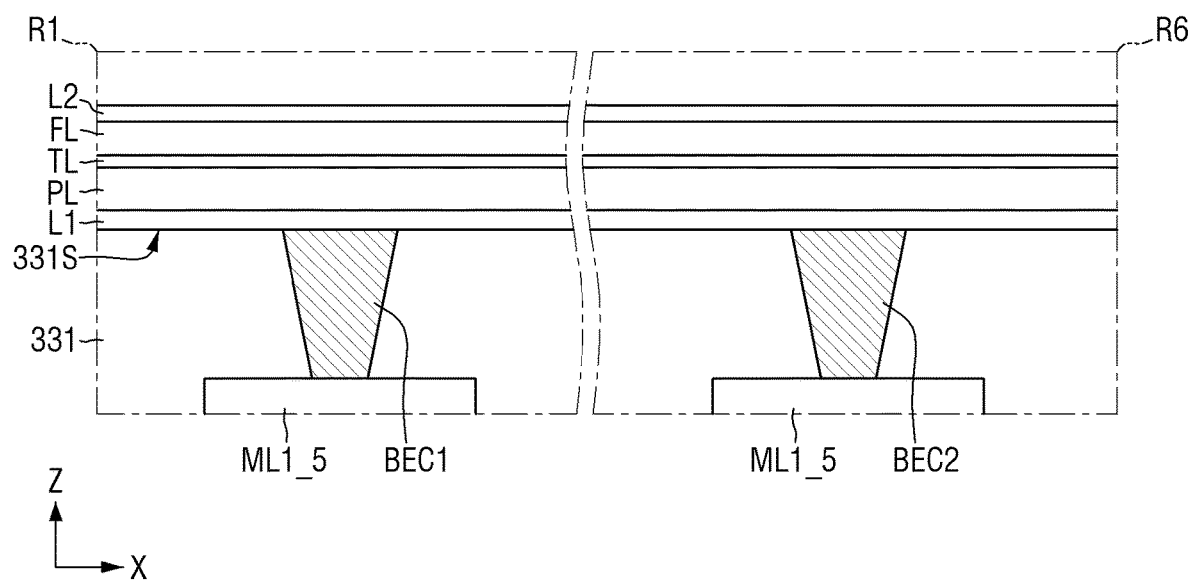

Referring to FIG. 17, the first layer L1, the fixed layer PL, the tunnel layer TL, the free layer FL, and the second layer L2 may be sequentially deposited on the first insulating layer 331. That is, the first layer L1, the fixed layer PL, the tunnel layer TL, the free layer FL, and the second layer L2 may be sequentially formed on the, e.g., entire, top surface 331S of the first insulating layer 331.

Figure 18:
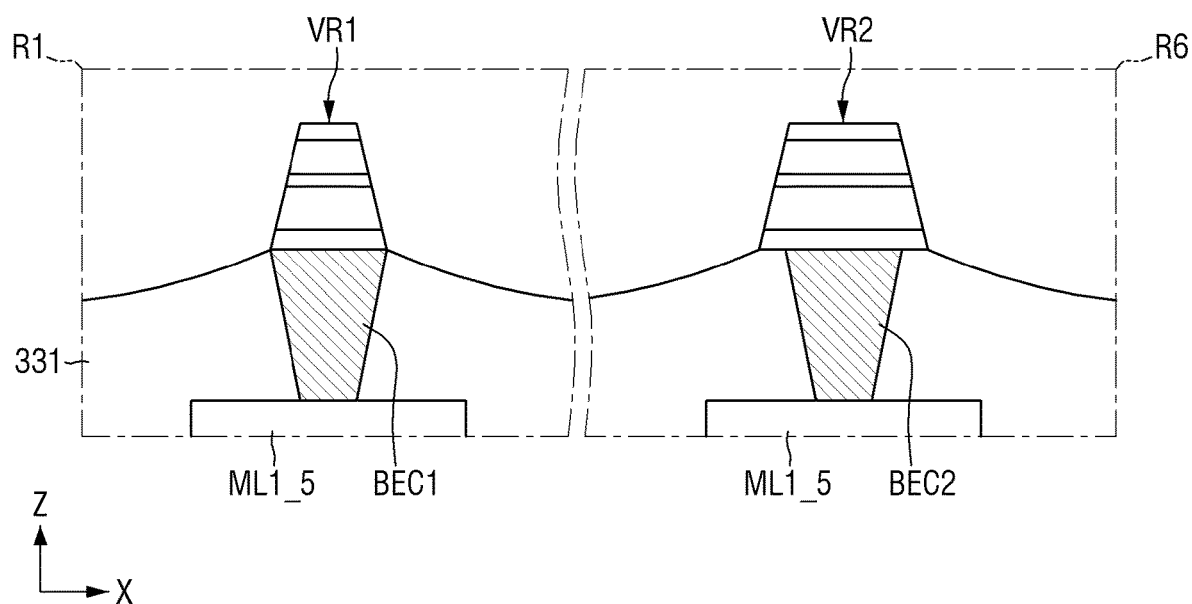

Referring to FIG. 18, the first and second variable resistance elements VR1 and VR2 may be formed by patterning the first layer L1, the fixed layer PL, the tunnel layer TL, and the free layer FL through etching, e.g., using the second layer as an etching mask. The etching of the first layer L1, the fixed layer PL, the tunnel layer TL, and the free layer FL may be performed by an etching process, e.g., an ion beam etching (IBE) process using argon (Ar) or krypton (Kr) ions.

As a result of the IBE process, the first layer L1, the fixed layer PL, the tunnel layer TL, the free layer FL, and the second layer L2 may be etched. That is, the first and second variable resistance elements VR1 and VR2 may be formed by etching parts of the first layer L1, the fixed layer PL, the tunnel layer TL, the free layer FL, and the second layer L2 that are not defined as the first and second variable resistance elements VR1 and VR2.

The width of the first variable resistance element VR1 may be smaller than the width of the second variable resistance element VR2. The first and second variable resistance elements VR1 and VR2 may have a greater width at the bottoms, e.g., surfaces facing the respective first and second contacts BEC1 and BEC2, than the tops, e.g., surfaces opposite the bottoms, thereof.

The first insulating layer 331 may be recessed by the IBE process. For example, the top surface 331S of the first insulating layer 331 may be downwardly recessed. That is, the top surface 331S of the first insulating layer 331 may be downwardly recessed between the first and second variable resistance elements VR1 and VR2.

Figure 19:
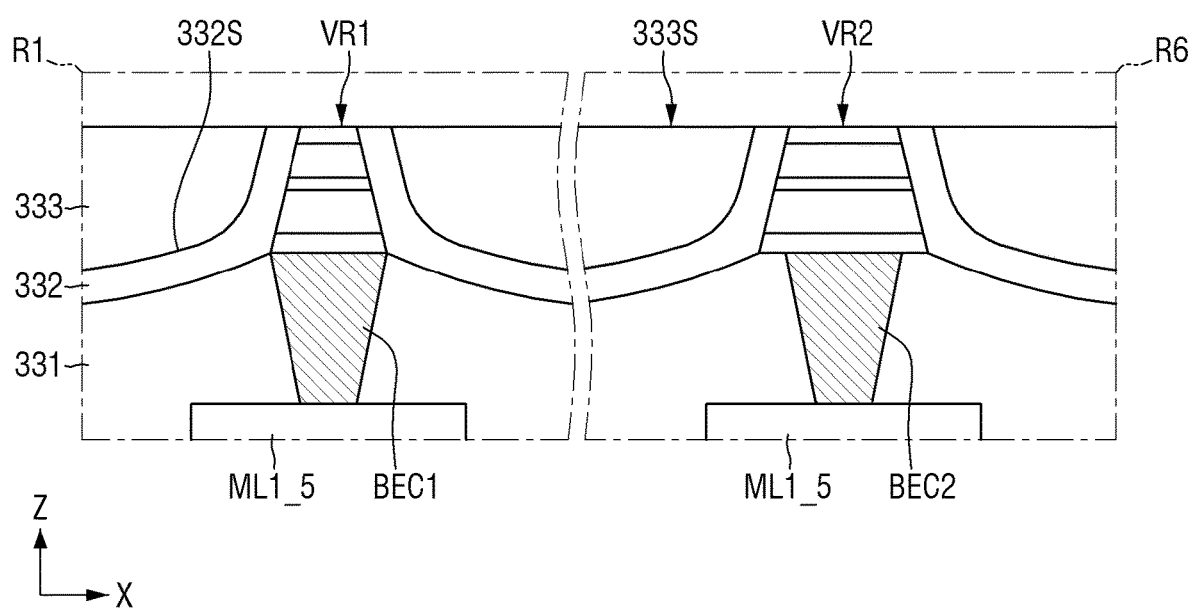

Referring to FIG. 19, the capping film 332 may be formed on the first insulating layer 331. The capping film 332 may be formed on the top surface 331S of the first insulating layer 331 and along the sidewalls and the top surface of each of the first and second variable resistance elements VR1 and VR2. An outer surface 332S of the capping film 332 may be downwardly recessed. That is, the outer surface 332S of the capping film 332 may be downwardly recessed between the first and second variable resistance elements VR1 and VR2.

The second insulating layer 333 may be formed on the capping film 332. The second insulating layer 333 may cover the outer surface 332S of the capping film 332. Thereafter, a top surface 333S of the second insulating layer 333 may be etched. As the top surface 333S of the second insulating layer 333 is etched, the capping film 332, the first variable resistance element VR1, and the second variable resistance element VR2 may be exposed at the top surface 333S of the second insulating layer 333. For example, the outer surface 332S of the capping film 332 and the top surfaces of the first and second variable resistance elements VR1 and VR2 may be exposed at the top surface 333S of the second insulating layer 333.

Thereafter, the second metal layers ML2 may be formed on the top surface 333S of the second insulating layer 333. The second metal layers ML2 may be directly connected to the first and second variable resistance elements VR1 and VR2. Also, the first metal layers ML1_5 may be electrically connected to the second metal layers ML2 via the first and second contacts BEC1 and BEC2 and the first and second variable resistance elements VR1 and VR2. Accordingly, the first and second variable resistance elements VR1 and VR2 can be placed between the first metal layers ML1_5 and the second metal layers ML2, and data can be stored in the first and second variable resistance elements VR1 and VR2.

Figure 20:
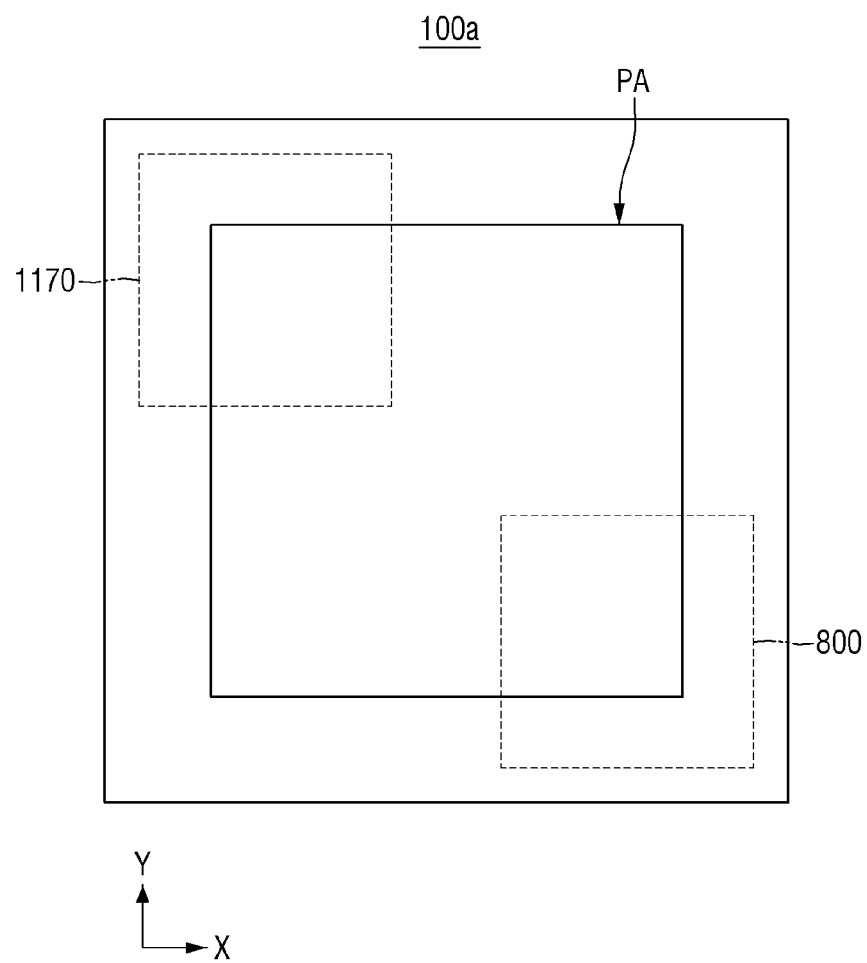
FIGS. 20 through 22 are top views of the locations of a nonvolatile memory device and a buffer in an image sensor according to some embodiments.
Figure 21:
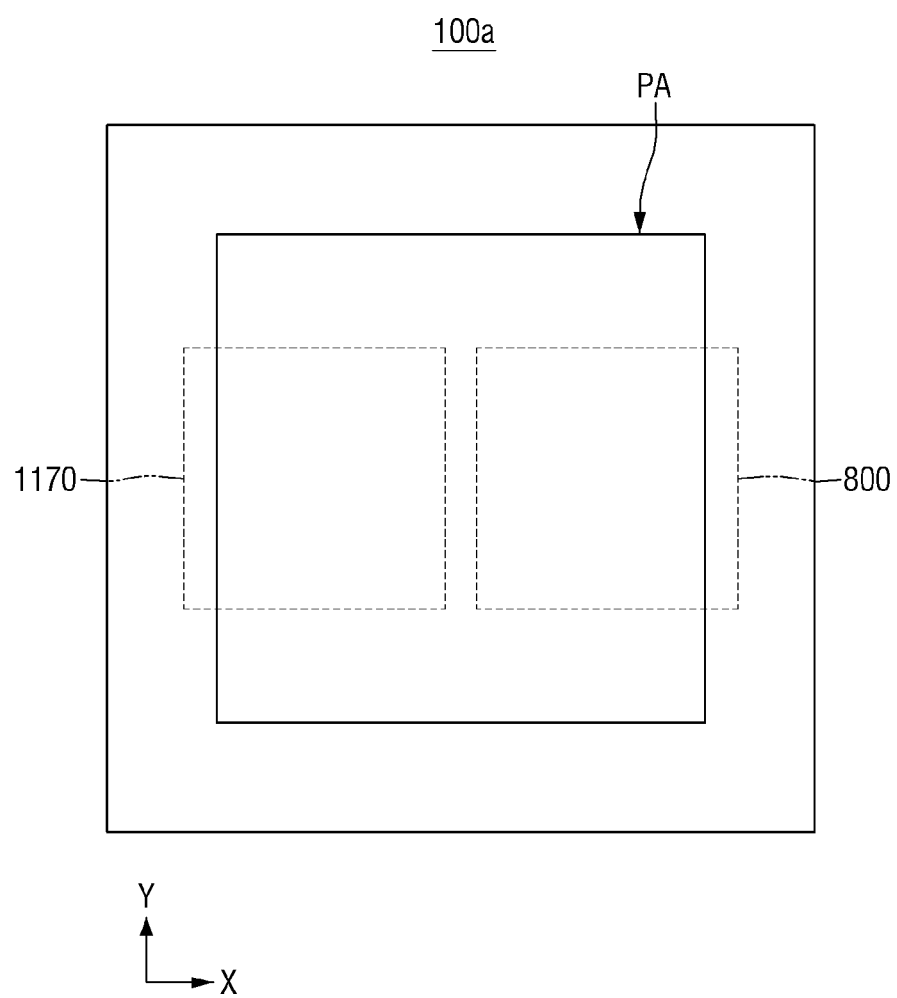
Figure 22:
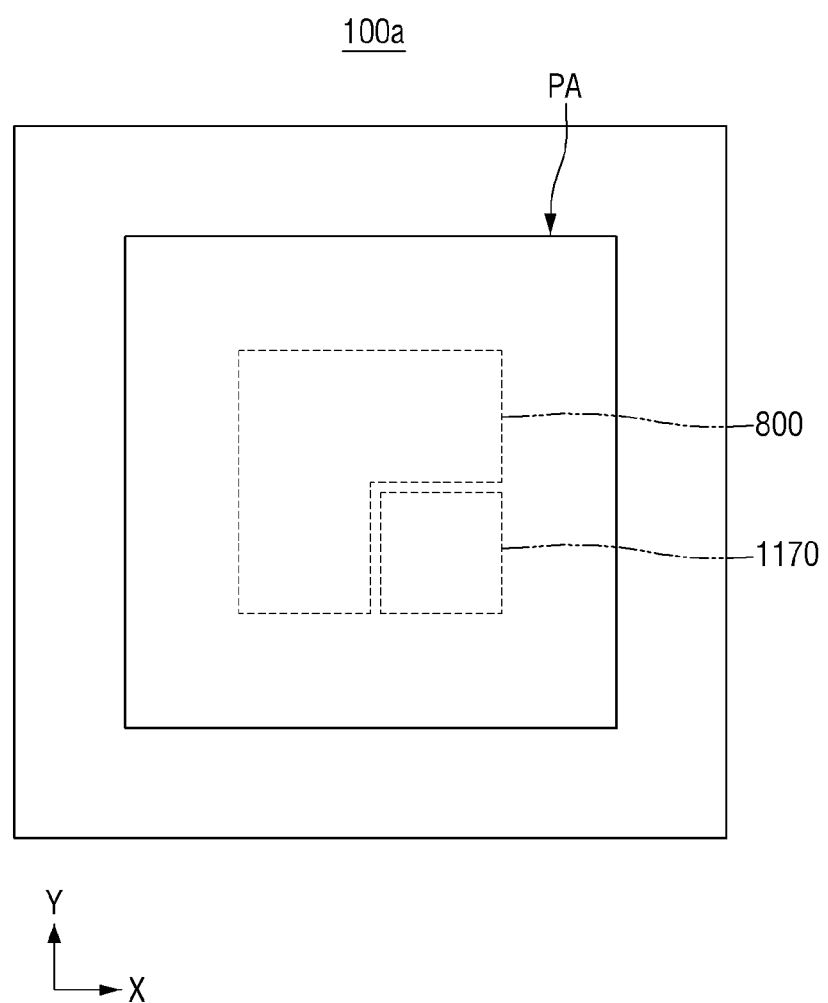

FIGS. 20 through 22 are top views illustrating the locations of the nonvolatile memory device 800 and the buffer 1700 in an image sensor according to some embodiments.

Referring to FIG. 20, the nonvolatile memory device 800 and the buffer 1170 of the image sensor 100a may be disposed to be spaced apart from each other. That is, as viewed from above, the nonvolatile memory device 800 and the buffer 1170 may both be disposed at an edge area of the image sensor 100a, e.g., the nonvolatile memory device 800 and the buffer 1170 may be at diagonally opposite corners of the image sensor 100a to only partially overlap diagonally opposite corners of the pixel array PA. The buffer 1170 may include the first variable resistance element VR1, and the nonvolatile memory device 800 may include the second variable resistance element VR2. Referring again to FIG. 13, as the first and second variable resistance elements VR1 and VR2 are both disposed in the sixth metal level LV6, the nonvolatile memory device 800 and the buffer 1170 may be spaced apart from each other.

Referring to FIG. 21, the nonvolatile memory device 800 and the buffer 1170 may be disposed in the middle part of the image sensor 100a. For example, the nonvolatile memory device 800 and the buffer 1170 may both be disposed in the middle part of the image sensor 100a where the pixel array PA is disposed, e.g., the nonvolatile memory device 800 and the buffer 1170 may be adjacent to each other along the first direction X to overlap a majority of a center of the pixel array PA. The nonvolatile memory device 800 and the buffer 1170 may be disposed to be spaced apart from each other, e.g., along the first direction X.

Referring to FIG. 22, the nonvolatile memory device 800 and the buffer 1170 may be disposed in the middle of the image sensor 100a. For example, the nonvolatile memory device 800 and the buffer 1170 may both be disposed in the middle part of the image sensor 100a where the pixel array PA is disposed. The buffer 1170 may be located in a recessed part of the nonvolatile memory device 800. That is, the buffer 1170 may be disposed adjacent to the nonvolatile memory device 800, but the buffer 1170 and the nonvolatile memory device 800 may not be in contact with each other or may not be connected to each other. For example, as illustrated in FIG. 22, the nonvolatile memory device 800 may be L-shaped in a top view to overlap two sides of the buffer 1170.

Figure 23:
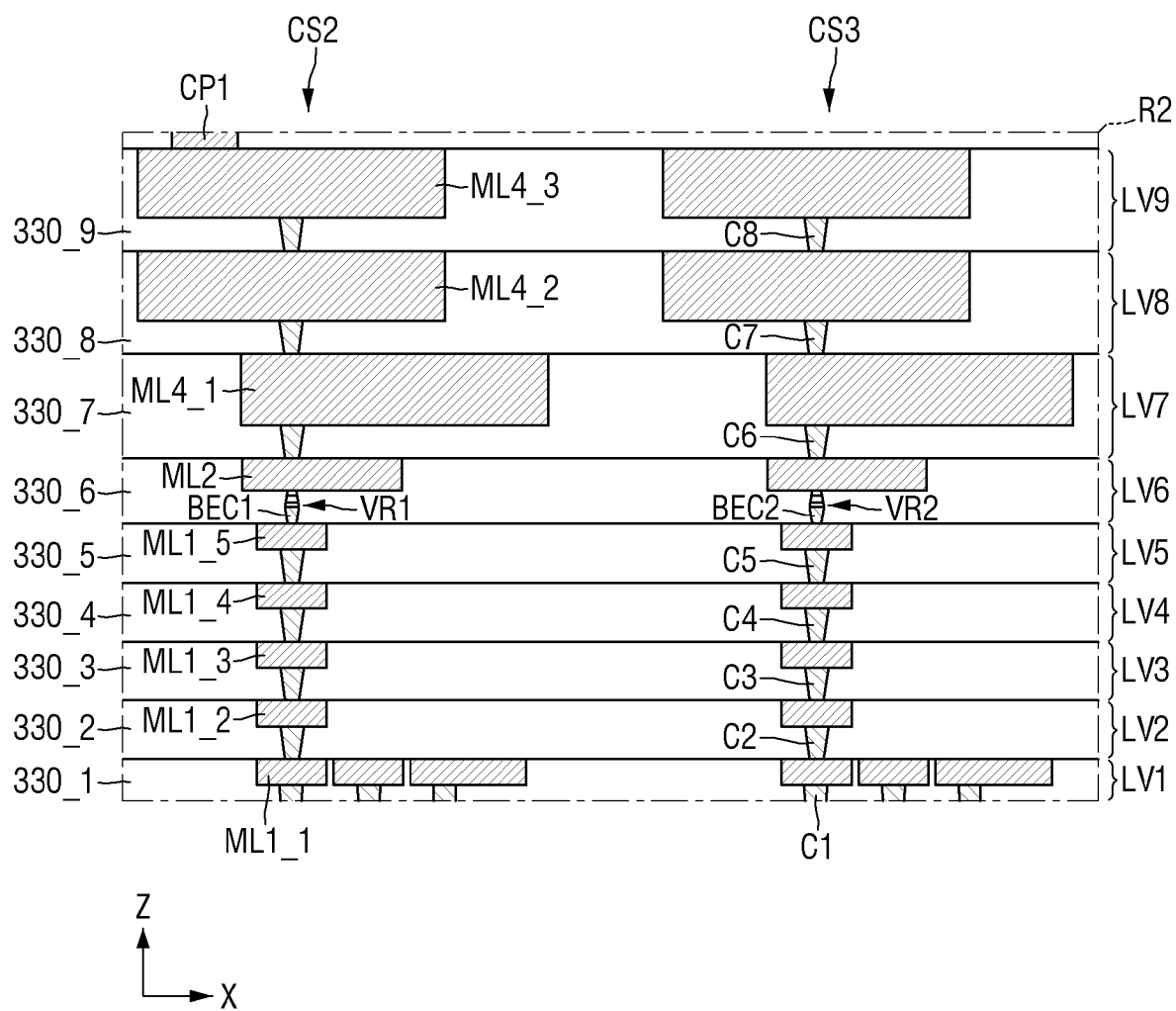
FIGS. 23 and 24 are cross-sectional views of lower chips according to some embodiments.
Figure 24:
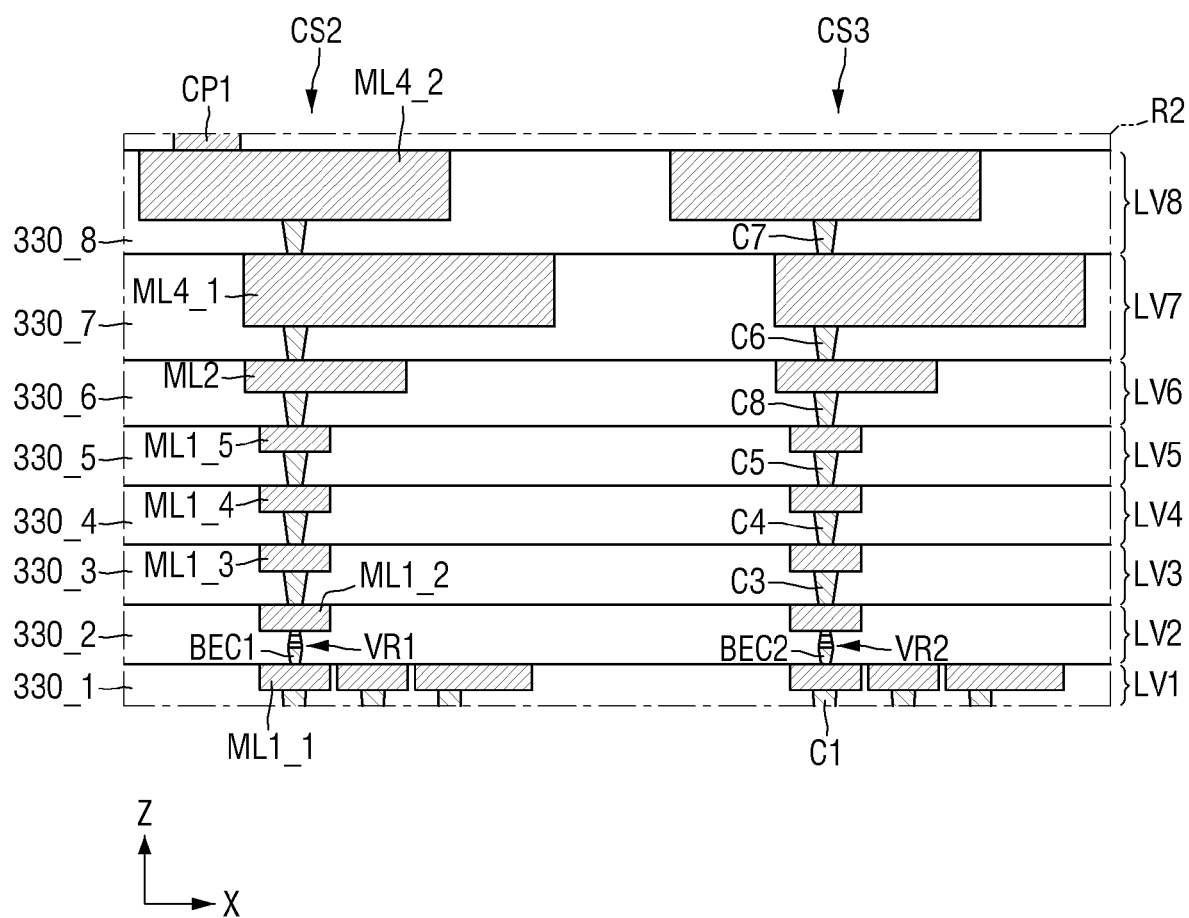

FIGS. 23 and 24 are cross-sectional views of the lower chip 300 according to some embodiments. FIGS. 23 and 24 correspond to the cross-section of region R2 in FIG. 13.

Referring to FIG. 23, the inter-wire insulating layer 330 of the lower chip 300 may further include a ninth insulating layer 330_9. The lower chip may include fourth metal layers ML4_3 and contacts C8, which are disposed in the inter-wire insulating layer 330. The fourth metal layers ML4_3 and the contacts C8 may be located in a ninth level LV9. That is, the lower chip 300, unlike its counterpart of FIG. 13, may further include the fourth metal layers ML4_3, but the present disclosure is not limited thereto, e.g., any suitable number of additional insulating layers may be added.

Referring to FIG. 24, the first and second variable resistance elements VR1 and VR2 of the lower chip 300 may both be located in the second metal level LV2. The first and second variable resistance elements VR1 and VR2 may be disposed between the first metal layers ML1_1 and the first metal layers ML1_2. The lower chip 300 may further include contacts C8, which are formed between the first metal layers ML1_5 and the second metal layers ML2.

In a case where the first and second variable elements VR1 and VR2 are located in the second metal level LV2, the first and second variable resistance elements VR1 and VR2 may be disposed closest to the second transistors TR2 and TR2', respectively. Accordingly, the performances of the buffer 1170 including the first variable resistance element VR1 and the nonvolatile memory device 800 including the second variable resistance element VR2 may be further improved.

Figure 25:
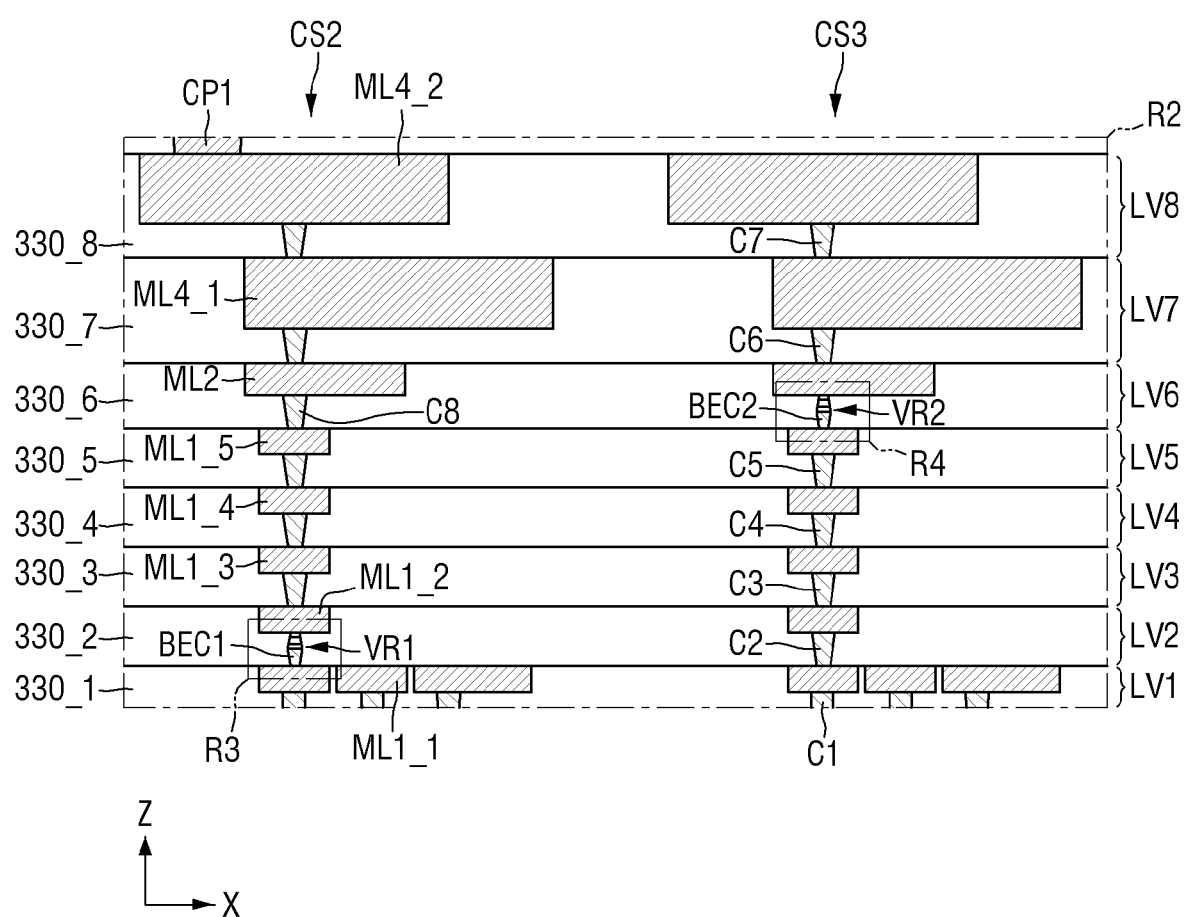
FIG. 25 is a cross-sectional view of a lower chip according to some embodiments.
Figure 26:
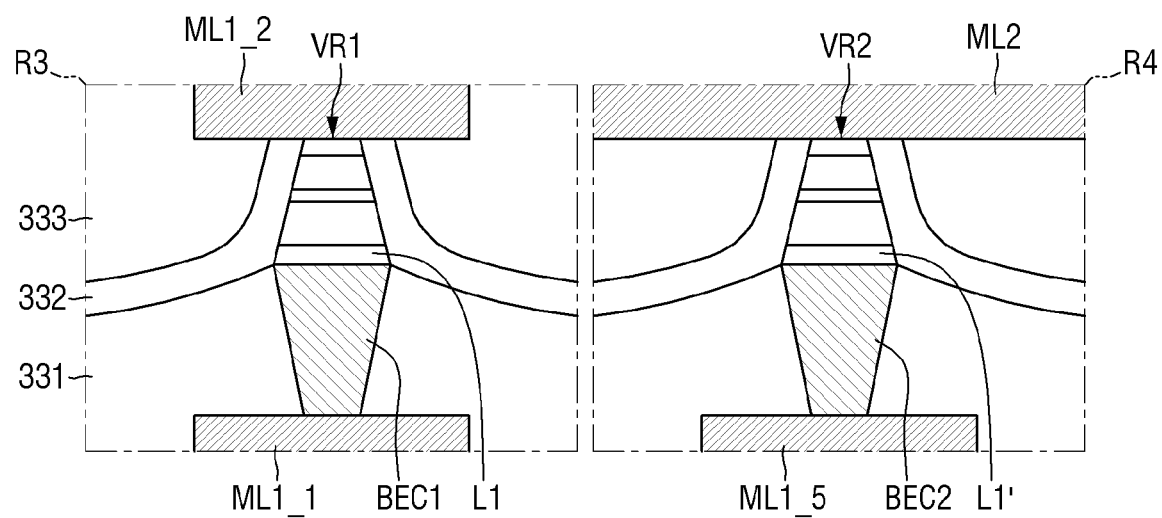
FIG. 26 illustrates enlarged cross-sectional views of regions R3 and R4 of FIG. 25.

FIG. 25 is a cross-sectional view of the lower chip 300 according to some embodiments. FIG. 26 illustrates enlarged cross-sectional views of regions R3 and R4 of FIG. 25. FIG. 25 corresponds to the cross-section of region R2 in FIG. 13.

Referring to FIG. 25, the first and second variable resistance elements VR1 and VR2 may be disposed in different layers. For example, the first variable resistance element VR1 may be located in the second metal level LV2, and the second variable resistance element VR2 may be located in the sixth metal level LV6. That is, the first variable resistance element VR1 may be disposed between the first metal layers ML1_1 and the first metal layer ML1_2 of the second connecting structure CS2, and the second variable resistance element VR2 may be disposed between the first metal layer ML1_5 and the second metal layer ML2 of the third connecting structure CS3.

The buffer 1170 including the first variable resistance element VR1 may be disposed adjacent to the second transistor TR2 and can thus be quickly accessed. The nonvolatile memory device 800 including the second variable resistance element VR2 may not be disposed adjacent to the second transistor TR2'.

Referring to FIG. 26, the first layer L1 of the first variable resistance element VR1 and a first layer L1' of the second variable resistance element VR2 may include different materials. For example, the first layer L1 of the first variable resistance element VR1 and the first layer L1' of the second variable resistance element VR2 may include a metal nitride, e.g., tantalum nitride, titanium nitride, or tungsten nitride.

For example, in a case where the first layer L1 of the first variable resistance element VR1 includes titanium nitride, the first layer L1' of the second variable resistance element VR2 may include tantalum nitride or tungsten nitride. As the first and second variable resistance elements VR1 and VR2 are located in different layers, the elements of the first layer L1 may differ from the elements of the first layer L1'.

As the first layer L1 of the first variable resistance element VR1 and the first layer L1' of the second variable resistance element VR2 include different materials, the first and second variable resistance elements the VR1 and VR2 may have different properties. For example, the operating speed of the first variable resistance element VR1 may be faster than the operating speed of the second variable resistance element VR2.

Figure 27:
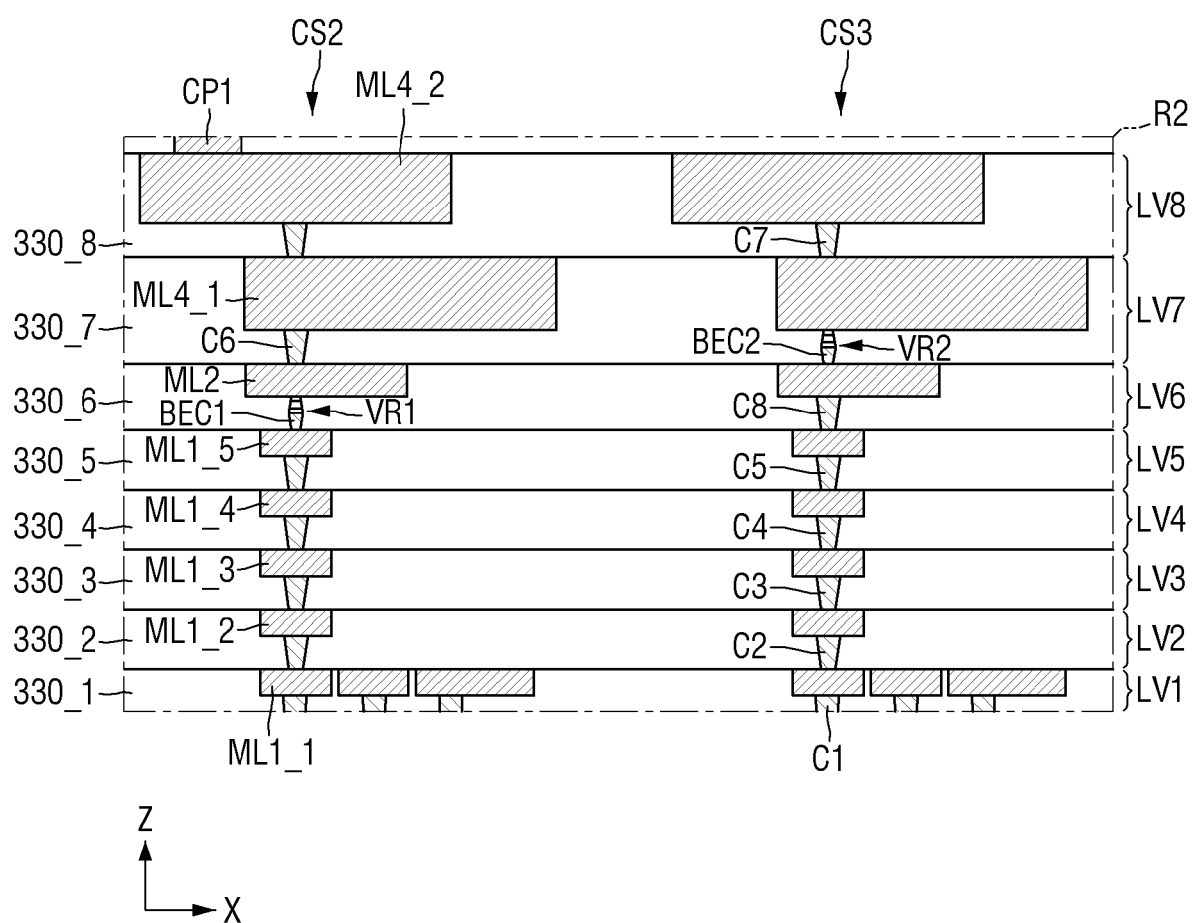
FIG. 27 is a cross-sectional view of a lower chip according to some embodiments.

FIG. 27 is a cross-sectional view of the lower chip 300 according to some embodiments. FIG. 27 corresponds to the cross-section of region R2 in FIG. 13.

Referring to FIG. 27, the first variable resistance element VR1 may be located in the sixth metal level LV6, and second variable resistance element VR2 may be located in the seventh metal level LV7. The first variable resistance element VR1 may be disposed between the first metal layer ML1_5 and the second metal layer ML2 of the second connecting structure CS2, and the second variable resistance element VR2 may be disposed between the second metal layer ML2 and the fourth metal layer ML4_1 of the third connecting structure CS3. That is, the first and second variable resistance elements VR1 and VR2 may be located in different layers.

Figure 28:
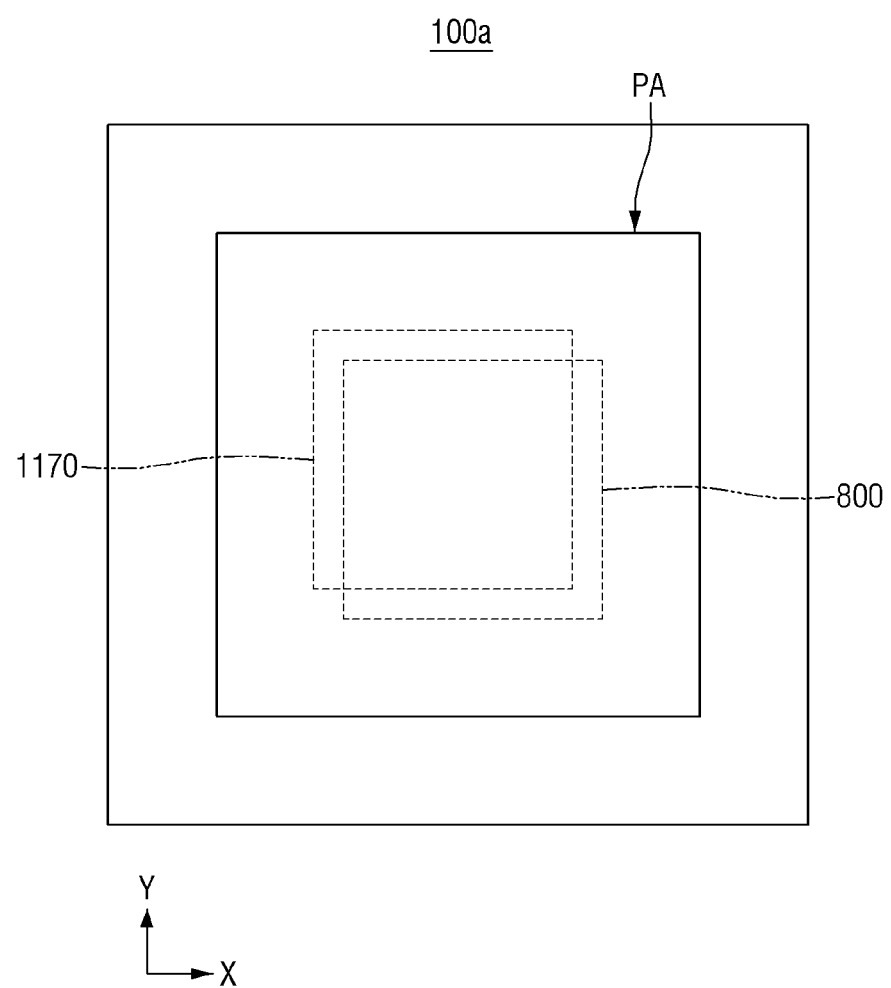
FIG. 28 is a top view of the locations of a nonvolatile memory device and a buffer in an image sensor according to some embodiments.

FIG. 28 is a top view illustrating the locations of the nonvolatile memory device 800 and the buffer 1170 in the image sensor 100a according to some embodiments.

Referring to FIG. 28, the nonvolatile memory device 800 may be laid over the buffer 1170, or the buffer 1170 may be laid over the nonvolatile memory device 800, e.g., the buffer 1170 and the nonvolatile memory device 800 may overlap each other in a top view. In this case, the first and second variable resistance elements VR1 and VR2 may be located in different metal levels. For example, the buffer 1170 including the first variable resistance element VR1 and the nonvolatile memory device 800 including the second variable resistance element VR2 may overlap with each other, as illustrated in FIG. 28. However, the present disclosure is not limited to this example. In another example, as illustrated in FIGS. 20 and 22, the nonvolatile memory device 800 and the buffer 1170 may not overlap with each other.

An image sensor according to some embodiments will hereinafter be described with reference to FIGS. 29 through 35.

Figure 29:
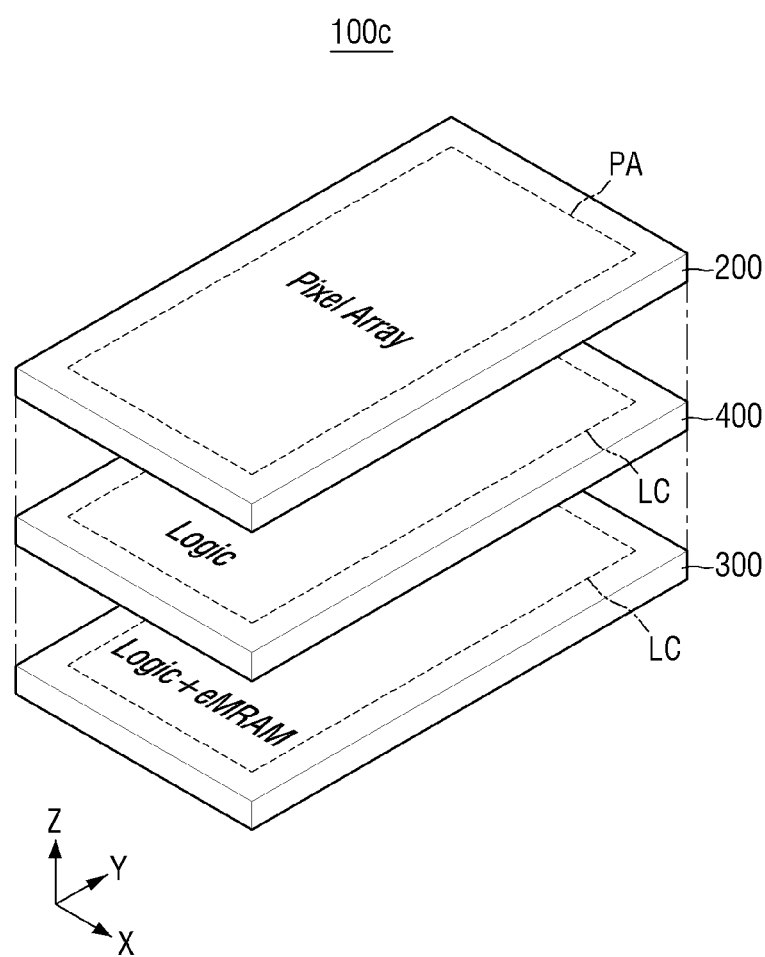
FIG. 29 is a layout view of an image sensor according to some embodiments.
Figure 30:
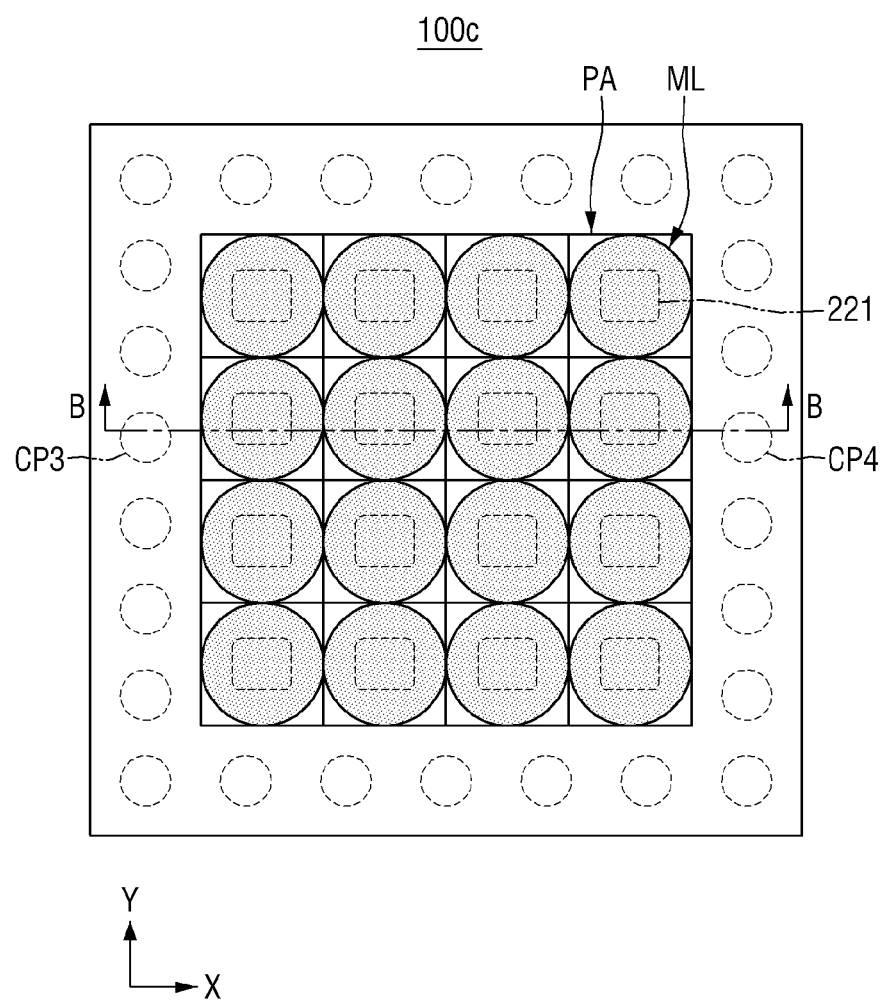
FIG. 30 is a top view of the image sensor of FIG. 29.
Figure 31:
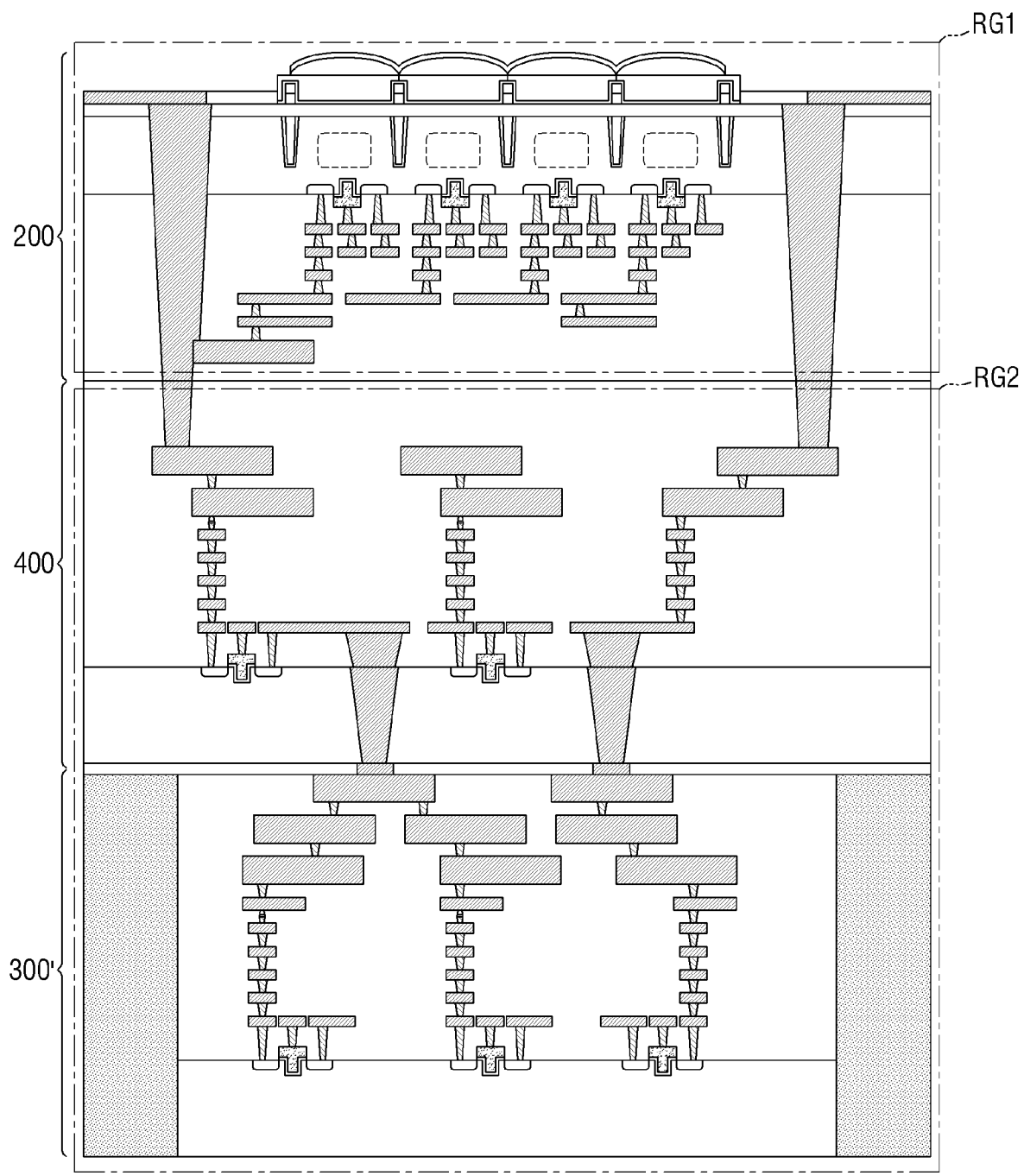
FIGS. 31 through 33 are cross-sectional views taken along line B-B of FIG. 30.
Figure 32:
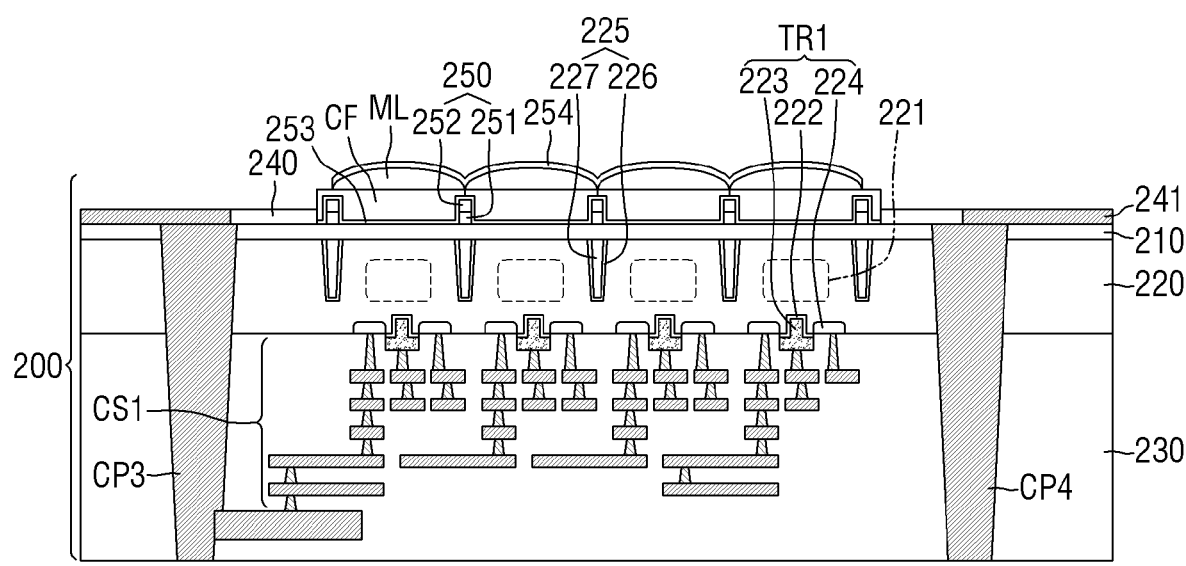
Figure 33:
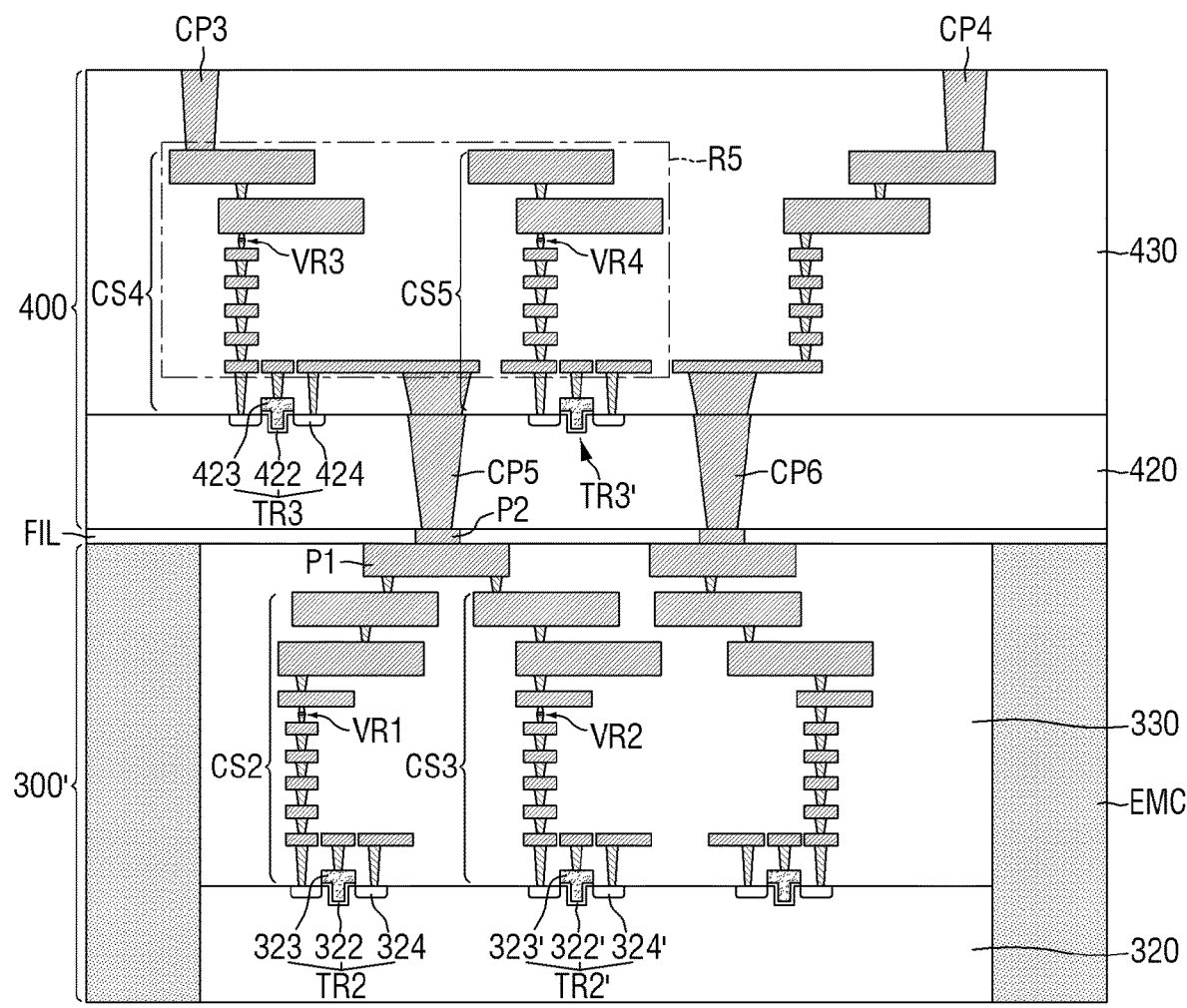
Figure 34:
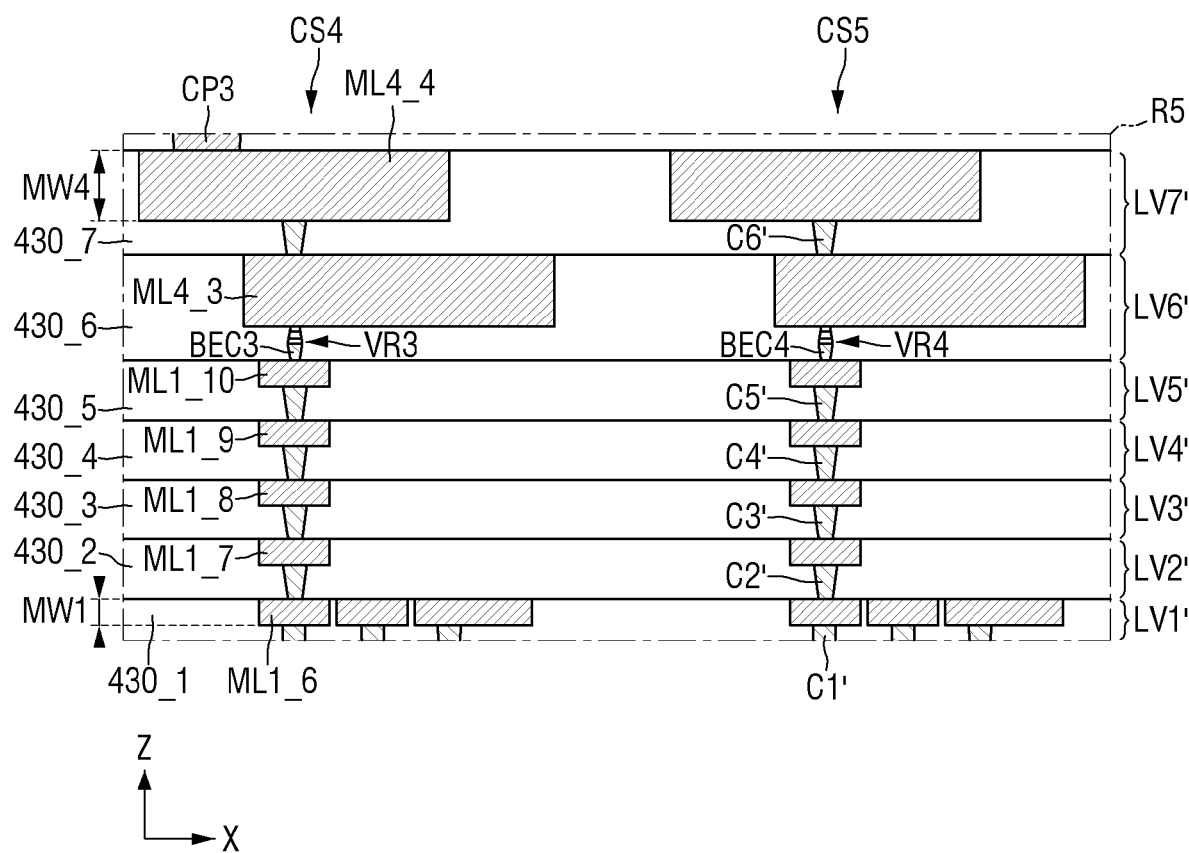
FIGS. 34 and 35 are enlarged cross-sectional views of a region R5 of FIG. 33.
Figure 35:
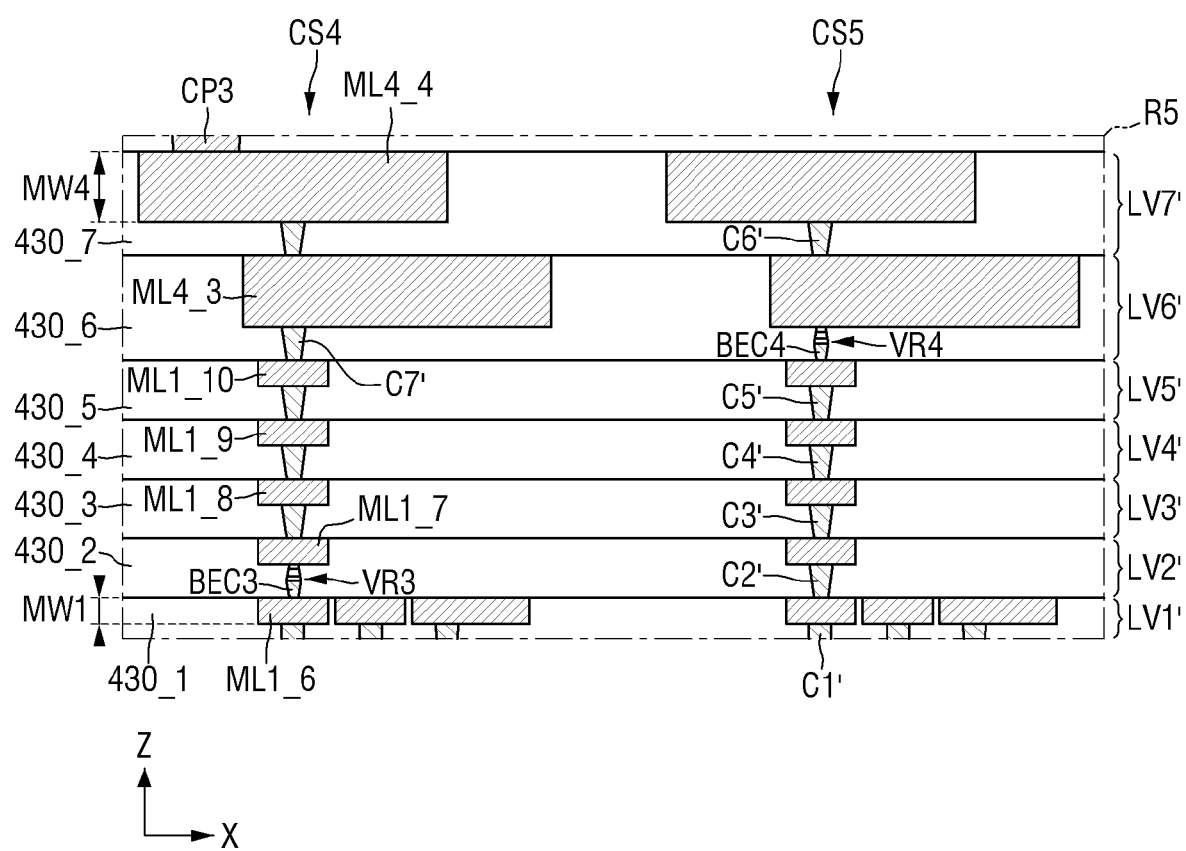

FIG. 29 is a layout view of an image sensor according to some embodiments. FIG. 30 is a top view of the image sensor of FIG. 29. FIGS. 31 through 33 are cross-sectional views taken along line B-B of FIG. 30. FIGS. 34 and 35 are enlarged cross-sectional views of region R5 of FIG. 33. For convenience, descriptions of elements or features that have been described above with reference to FIGS. 1 through 28 will be omitted or simplified.

Referring to FIG. 29, the image sensor 100c may include the upper chip 200, a middle chip 400, and the lower chip 300. The middle chip 400 may be stacked on the lower chip 300, and the upper chip 200 may be stacked on the middle chip 400. The upper chip 200 and the lower chip 300 may have the same structures as their respective counterparts of FIGS. 1 through 28. The middle chip 400 may be disposed between the upper chip 200 and the lower chip 300. The middle chip 400 may include logic elements of the image sensor 100c.

Referring to FIGS. 30 through 33, the upper chip 200, the middle chip 400, and a lower chip 300' may be sequentially stacked.

The lower chip 300' may include a molding film EMC. The molding film EMC may extend along the sidewalls of the semiconductor substrate 320 and the sidewalls of the inter-wire insulating layer 330. That is, the molding film EMC may surround the semiconductor substrate 320 and the inter-wire insulating layer 330. However, the molding film EMC may not cover the top surface of the inter-wire insulating layer 330. The molding film EMC may protect the lower chip 300' from external interference and shock.

As illustrated in FIG. 33, the lower chip 300' may include pads (P1 and pads P2). Pads P1 may be disposed in the inter-wire insulating layer 330. The pads P1 may be connected to the second and third connecting structures CS2 and CS3 via contacts. The top surfaces of the pads P1 may be exposed at the top surface of the inter-wire insulating layer 330. Pads P2 may be formed on the top surfaces of the pads P1. The pads (P1 and P2) may be connected to metal layers and may thus be able to transmit or receive electrical signals.

A filler FIL may be formed between the middle chip 400 and the lower chip 300'. That is, the filler FIL may fill the space between the middle chip 400 and the lower chip 300'. The filler FIL may protect the pads P2 from the outside and may improve the adhesion between the middle chip 400 and the lower chip 300'.

The middle chip 400 may include a semiconductor substrate 420, third transistors TR3 and TR3', a fifth contact plug CP5, and a sixth contact plug CP6.

The third transistors TR3 may be formed on the semiconductor substrate 420, but the present disclosure is not limited thereto. Alternatively, only part of the third transistor TR3 may be formed on the semiconductor substrate 420, and another part of the third transistor TR3 may be recessed in the semiconductor substrate 420. The third transistor TR3 may include a gate insulating film 422, a gate electrode 423, and an impurity-injected area 424. The third transistor TR3' may also be formed on the semiconductor substrate 420.

The fifth and sixth contact plugs CP5 and CP6 may be formed in the semiconductor substrate 420. The fifth and sixth contact plugs CP5 and CP6 may penetrate the semiconductor substrate 420. That is, the fifth and sixth contact plugs CP5 and CP6 may be exposed at the top and the bottom of the semiconductor substrate 420. The fifth and sixth contact plugs CP5 and CP6 may be formed during the formation of the third transistors TR3. However, the present disclosure is not limited to this.

The fifth and sixth contact plugs CP5 and CP6 may be bonded to the pads P2 of the lower chip 300'. Also, the fifth and sixth contact plugs CP5 and CP6 may be electrically connected to the pads P2. The fifth and sixth contact plugs CP5 and CP6 may transmit or receive electrical signals.

The middle chip 400 may include an inter-wire insulating layer 430, a fourth connecting structure CS4, and a fifth connecting structure CS5. The inter-wire insulating layer 430 may be formed on the semiconductor substrate 420. The fourth and fifth connecting structures CS4 and CS5 may be formed in the inter-wire insulating layer 430.

Third and fourth contact plugs CP3 and CP4 may extend from the top surface of the upper chip 200 and may be connected to the fourth connecting structure CS4. The third and fourth contact plugs CP3 and CP4 may transmit or receive electrical signals.

Referring to FIG. 34, the inter-wire insulating layer 430 may include first through seventh sub-insulating layers 430_1 through 430_7. The first through seventh sub-insulating layers 430_1 through 430_7 may be located in first through seventh metal levels LV1' through LV7', respectively. First metal layers (ML1_6 through ML1_10) and fourth metal layers (ML4_3 and ML4_4) may be disposed in the first through seventh sub-insulating layers 430_1 through 430_7. The first metal layers (ML1_6 through ML1_10) and the fourth metal layers (ML4_3 and ML4_4) may be connected by contacts (C1' through C6').

The first metal layers (ML1_6 through ML1_10) may have a first thickness MW1, and the fourth metal layers (ML4_3 and ML4_4) may have a fourth thickness MW4. The fourth thickness MW4 may be greater than the first thickness MW1.

Third and fourth variable resistance elements VR3 and VR4 may both be located in the sixth metal level LV6'. The third and fourth variable resistance elements VR3 and VR4 may be disposed between first metal layers ML1__10 and fourth metal layers ML4_3. One of the third and fourth variable resistance elements VR3 and VR4 may operate as the buffer 1170, and the other variable resistance element may operate as the nonvolatile memory device 800. That is, the third and fourth variable resistance elements VR3 and VR4, like first and second variable resistance elements VR1 and VR2 of the lower chip, may have different properties.

Referring to FIG. 35, the third variable resistance element VR3 may be located in the second metal level LV2', and the fourth variable resistance element VR3 may be located in the sixth metal level LV6'. The third variable resistance element VR3 may be disposed between a first metal layer ML1_6 and a first metal layer ML1_7 of the fourth connecting structure CS4. The third and fourth variable resistance elements VR3 and VR4, unlike their respective counterparts of FIG. 34, may be located in different metal levels.

An electronic device according to some embodiments will hereinafter be described with reference to FIGS. 36 and 37.

Figure 36:
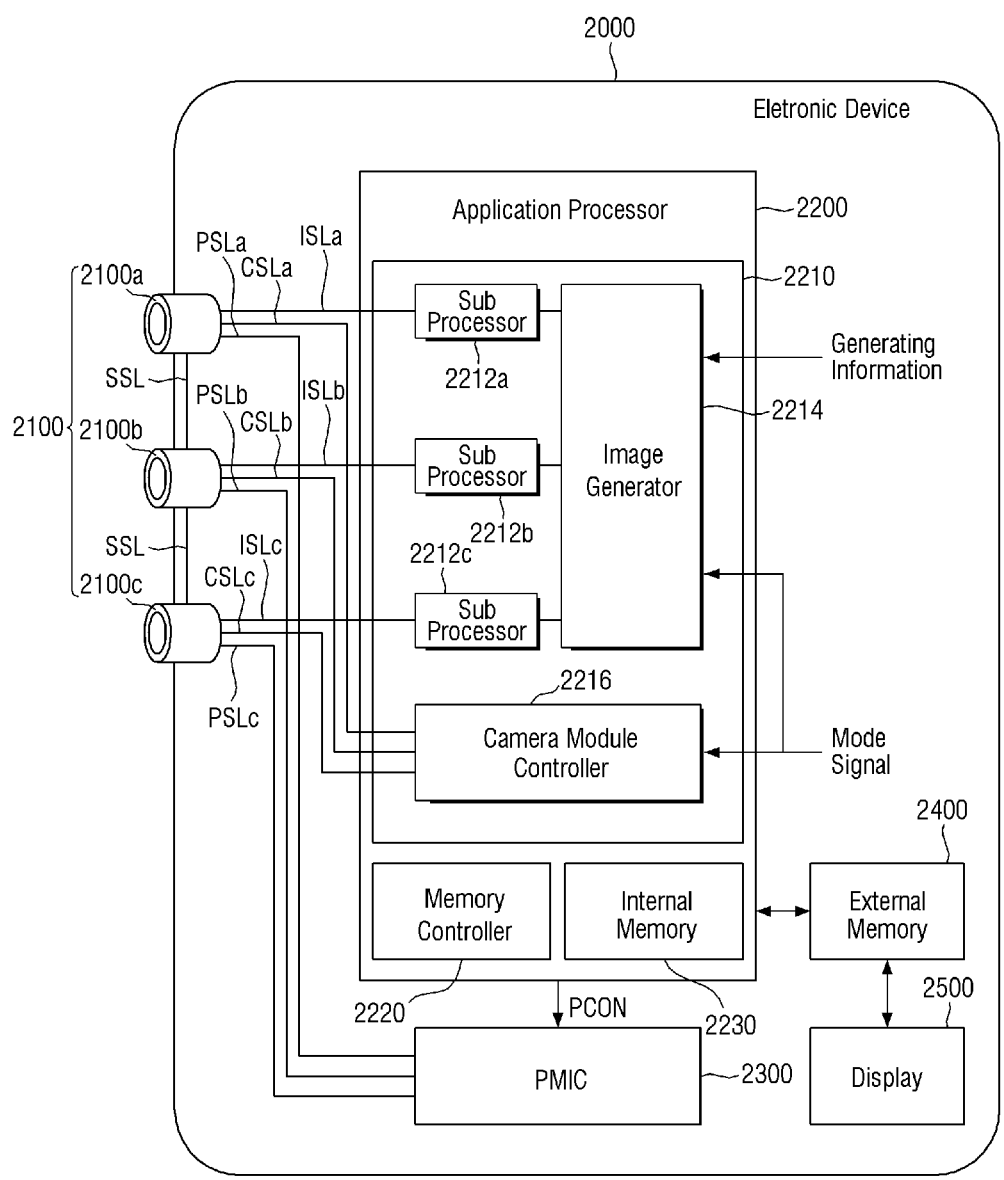
FIG. 36 is a block diagram of an electronic device according to some embodiments.

FIG. 36 is a block diagram of an electronic device according to some embodiments. FIG. 37 is a detailed block diagram of a camera module of FIG. 36. For convenience, descriptions of elements or features that have already been described with reference to FIGS. 1 through 35 will be simplified or omitted.

Referring to FIG. 36, an electronic device 2000 may include a camera module group 2100, an application processor 2200, a power management integrated circuit (PMIC) 2300, an external memory 2400, and a display 2500.

The camera module group 2100 may include a plurality of camera modules 2100a, 2100b and 2100c. FIG. 36 illustrates that three camera modules are arranged, but the present disclosure is not limited thereto. For example, the camera module group 2100 may be configured to include only two camera modules or n camera modules (where n is a natural number of 4 or greater). One of the camera modules 2100a, 2100b and 2100c may be a camera module including any one of the image sensors of FIGS. 1 through 35.

The structure of the camera module 2100b will hereinafter be described with reference to FIG. 37. The following description of the camera module 2100b may be directly applicable to the other camera modules 2100a and 2100c.

Figure 37:
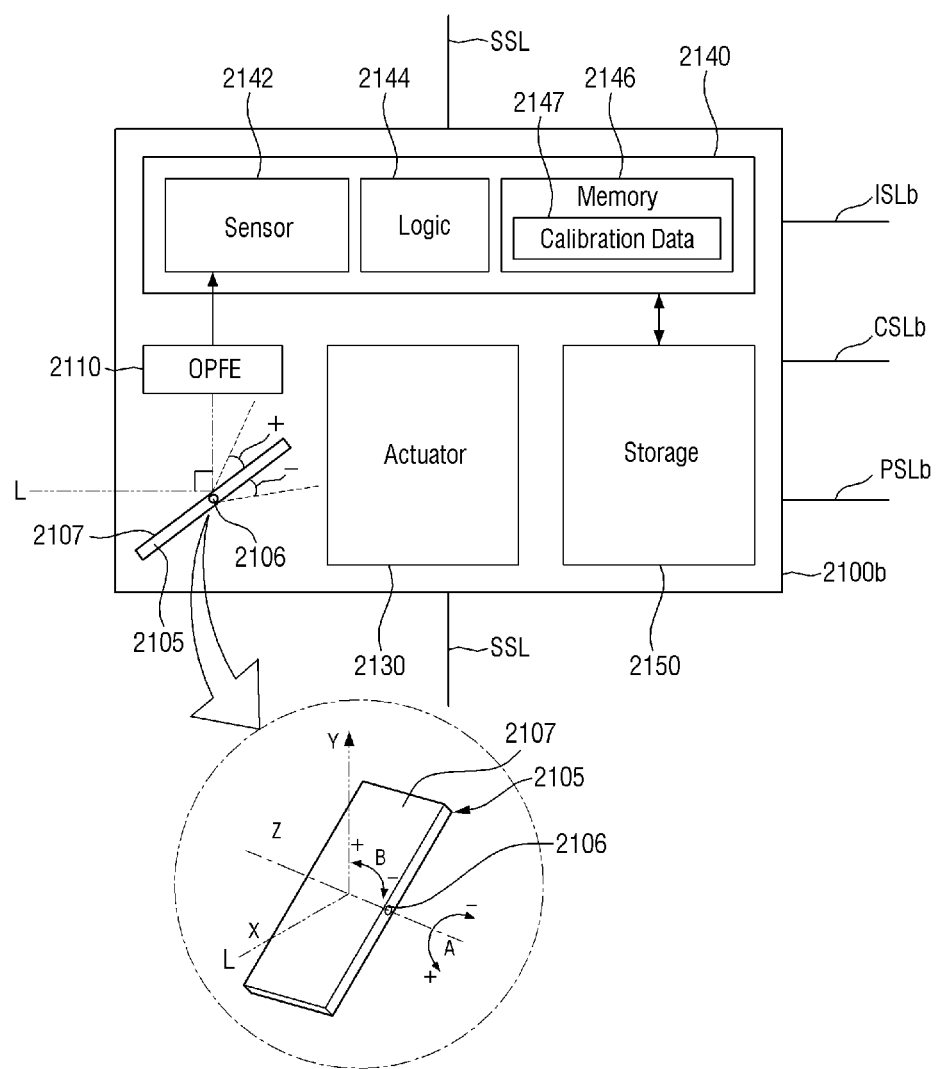
FIG. 37 is a detailed block diagram of a camera module of FIG. 36.

Referring to FIG. 37, the camera module 2100b may include a prism 2105, an optical path folding element (OPFE) 2110, an actuator 2130, an image sensing device 2140, and a storage 2150.

The prism 2105 may include a reflective surface 2107 of a light-reflecting material and may thus change the path of light L incident from the outside. In some embodiments, the prism 2105 may change the path of the light L from a first direction X to a second direction Y, which is perpendicular to the first direction X. The prism 2105 may change the path of the light L from the first direction X to the second direction Y by rotating the reflective surface 2107 in an A or B direction about a central axis 2106. In this case, the OPFE 2110 may be moved in a third direction Z, which is perpendicular to the first and second directions X and Y.

In some embodiments, the maximum rotation angle of the prism 2105 may be 15 degrees or less in a +A direction and may be greater than 15 degrees in a −A direction, but the present disclosure is not limited thereto. In some embodiments, the prism 2105 may be moved by about 20 degrees, e.g., about 10 to 20 degrees, or about 15 to 20 degrees in a +B or −B direction. The prism 2105 may be moved by the same angle or similar angles (with a difference of about one degree or less) in both the +B and −B direction. In some embodiments, the prism 2105 may move the reflective surface 2107 of the light-reflecting material in the third direction Z, which is parallel to the direction in which the central axis 2106 extends.

The OPFE 2110 may include, e.g., a group of m optical lenses (where m is a natural number). The m optical lenses may move in the second direction Y to change the optical zoom ratio of the camera module 2100b. For example, when the basic optical zoom ratio of the camera module 2100b is 'z', the optical zoom ratio of the camera module 2100b may be changed to 3z or 5z or greater by moving the m optical lenses of the OPFE 2110.

The actuator 2130 may move the OPFE 2110 or the optical lenses of the OPFE 2110 to a particular location. For example, the actuator 2130 may adjust the location of the optical lenses of the OPFE 2110 such that an image sensor 2142 can be placed at the focal length of the optical lenses of the OPFE 2110.

The image sensing device 2140 may include the image sensor 2142, a control logic 2144 and a memory 2146. The image sensor 2142 may sense an image of a target object using the light L provided thereto via the optical lenses. In some embodiments, the image sensor 2142 may include the image sensor 100, 100a, or 100c.

The control logic 2144 may control the general operation of the camera module 2100b. For example, the control logic 2144 may control the operation of the camera module 2100b in accordance with a control signal provided thereto via a control signal line CSLb.

The memory 2146 may store information necessary for the operation of the camera module 2100b, e.g., calibration data 2147. The calibration data 2147 may include information necessary for the camera module 2100b to generate image data based on the light L. The calibration data 2147 may include, e.g., degree-of-rotation information, focal length information, and optical axis information. In a case where the camera module 2100b is implemented as a multistate camera whose focal length changes depending on the location of optical lengths thereof, the calibration data 2147 may include focal length data for different locations (or states) of optical lenses and auto-focusing information. The memory 2146 may include the nonvolatile memory device 800. That is, the memory 2146 may be the nonvolatile memory device 800 including the second variable resistance element VR2.

The storage 2150 may store image data sensed by the image sensor 2142. The storage 2150 may be disposed on the outside of the image sensing device 2140 and may be stacked on or below a sensor chip of the image sensing device 2140. In some embodiments, the storage 2150 may be implemented as an electrically erasable programmable read-only memory (EEPROM), but the present disclosure is not limited thereto. The storage 2150 may be formed by the lower chip 300 or 300'. The storage 2150 may be the nonvolatile memory device 800 including the second variable resistance element VR2.

Referring to FIGS. 36 and 37, in some embodiments, the camera modules 2100a, 2100b and 2100c may include their own actuator 2130. Accordingly, the camera modules 2100a, 2100b and 2100c may include the same or different calibration data 2147 depending on the operation of their own actuator 2130.

For example, one of the camera modules 2100a, 2100b and 2100c, e.g., the camera module 2100b, may be a folded lens-type camera module including the prism 2105 and the OPFE 2110, and the other camera modules may be vertical camera modules including no prism 2105 and no OPFE 2110.

For example, one of the camera modules 2100a, 2100b and 2100c, e.g., the camera module 2100c, may be a vertical depth camera capable of extracting depth information using, e.g., infrared (IR) rays. In this case, the application processor 1200 may generate a three-dimensional (3D) depth image by merging image data provided by the camera module 2100c and image data provided by the other camera modules, i.e., the camera modules 2100a and 2100b.

For example, at least two of the camera modules 2100a, 2100b and 2100c, e.g., the camera modules 2100a and 2100c, may have different fields of view. In this case, at least two of the camera modules 2100a, 2100b and 2100c, e.g., the camera modules 2100a and 2100c, may have different sets of optical lenses, but the present disclosure is not limited thereto.

In some embodiments, the camera modules 2100a, 2100b and 2100c may all have different viewing angles. In this case, the camera modules 2100a, 2100b and 2100c may all have different sets of optical lenses, but the present disclosure is not limited thereto.

In some embodiments, the camera modules 2100a, 2100b and 2100c may be physically separated from one another. That is, the camera modules 2100a, 2100b and 2100c may have their own image sensor 2142 disposed therein, rather than sharing the sensing area of one image sensor 2142.

Referring again to FIG. 36, the application processor 2200 may include an image processor 2210, a memory controller 2220, and an internal memory 2230. The application processor 2200 may be configured to be separate from the camera modules 2100a, 2100b and 2100c. For example, the application processor 2200 may be implemented as a separate semiconductor chip from the camera modules 2100a, 2100b and 2100c.

The image processor 2210 may include a plurality of sub-image processors 2212a, 2212b and 2212c, an image generator 2214, and a camera module controller 2216. The image processor 2210 may include as many sub-image processors as there are camera modules.

Image data generated by the camera modules 2100a, 2100b and 2100c may be provided to the sub-image processors 2212a, 2212b and 2212c via separate image signal lines ISLa, ISLb and ISLc. For example, the image data generated by the camera module 2100a may be provided to the sub-image processor 2212a via the image signal line ISLa, the image data generated by the camera module 2100b may be provided to the sub-image processor 2212b via the image signal line ISLb, and the image data generated by the camera module 2100c may be provided to the sub-image processor 2212c via the image signal line ISLc. The image data generated by the camera modules 2100a, 2100b and 2100c may be transmitted via, e.g., a mobile industry processor interface (MIPI)-based camera serial interface (CSI), but the present disclosure is not limited thereto.

In some embodiments, one sub-image processor may be disposed to correspond to multiple camera modules. For example, the sub-image processors 2212a and 2212c may be incorporated into a single sub-image processor. In this example, one of image data provided by the camera module 2100a and image data provided by the camera module 2100c may be selected by, e.g., a multiplexer, and the selected image data may be provided to the single sub-image processor.

The image data provided to each of the sub-image processors 2212a, 2212b and 2212c may be provided to the image generator 2214. The image generator 2214 may generate an output image based on the image data provided to each of the sub-image processors 2212a, 2212b and 2212c, in accordance with image generating information or a mode signal.

In detail, the image generator 2214 may generate an output image by merging at least some of the image data generated by the camera modules 2100a, 2100b and 2100c, which have different viewing angles. Also, the image generator 2214 may generate an output image by selecting one of the image data generated by the camera modules 2100a, 2100b and 2100c, which have different viewing angles, in accordance with the image generating information or the mode signal.

In some embodiments, the image generating information may include a zoom signal (or a zoom factor). In some embodiments, the mode signal may be, e.g., a signal of a mode selected by a user.

If the image generating signal is a zoom signal (or a zoom factor) and the camera modules 2100a, 2100b and 2100c have different fields of view (or different viewing angles), the image generator 2214 may perform different operations depending on the type of the zoom signal. For example, if the zoom signal is a first signal, image data output by the camera module 2100a and image data output by the camera module 2100c may be merged together, and an output image may be generated using the merged image data and image data output by the camera module 2100b. For example, if the zoom signal is a second signal, which is different from the first signal, the image generator 2214 may generate an output image by selecting one of the image data output by the camera modules 2100a, 2100b and 2100c, instead of merging the image data output by the camera modules 2100a, 2100b and 2100c. However, the present disclosure is not limited thereto, e.g., the method to process image data may vary.

In some embodiments, the image generator 2214 may receive multiple image data having different exposure durations from at least one of the sub-image processors 2212a, 2212b and 2212c and may perform high dynamic range (HDR) processing on the multiple image data, thereby generating merged image data with an increased dynamic range.

The camera module controller 2216 may provide control signals to the camera modules 2100a, 2100b and 2100c. The control signals may be provided from the camera module controller 2216 to the camera modules 2100a, 2100b and 2100c via separate control signal lines CSLa, CSLb and CSLc.

In accordance with the image generating information or the mode signal, one of the camera modules 2100a, 2100b and 2100c, e.g., the camera module 2100a, may be designated as a master camera, and the other camera modules, i.e., the camera modules 2100b and 2100c, may be designated as slave cameras. This type of information may be included in a control signal and may thus be provided to the camera modules 2100a, 2100b and 2100c via the control signal lines CSLa, CSLb and CSLc.

The master camera and the slave cameras may be changed in accordance with a zoom signal (or a zoom factor) or the mode signal. For example, if the camera module 2100a has a wider field of view than the camera module 2100c and the zoom signal denotes a low zoom ratio, the camera module 2100c may operate as a master camera, and the camera module 2100a may operate as a slave camera. On the contrary, if the zoom signal denotes a high zoom ratio, the camera module 2100a may operate as a master camera, and the camera module 2100c may operate as a slave camera.

In some embodiments, the control signals provided from the camera module controller 2216 to the camera modules 2100a, 2100b and 2100c may include a sync enable signal. For example, if the camera module 2100b is a master camera and the camera modules 2100a and 2100c are slave cameras, the camera module controller 2216 may transmit the sync enable signal to the camera module 2100b. Then, the camera module 2100b may generate a sync signal based on the sync enable signal and may provide the sync signal to the camera modules 2100a and 2100c via sync signal lines SSL. As a result, the camera modules 2100a, 2100b and 2100c may all be synchronized with the sync signal to transmit image data to the application processor 2200.

In some embodiments, the control signals provided from the camera module controller 2216 to the camera modules 2100a, 2100b and 2100c may include mode information from the mode signal. The camera modules 2100a, 2100b and 2100c may operate in first and second operating modes, which are associated with a sensing speed, based on the mode information.

In the first operating mode, the camera modules 2100a, 2100b and 2100c may generate an image signal at a first speed (e.g., at a first frame rate), may encode the image signal at a second speed higher than the first speed (e.g., at a second frame rate higher than the first frame rate), and may transmit the encoded image signal to the application processor 2200. The second speed may be 30 times or less the first speed.

The application processor 2200 may store a received image signal, i.e., an encoded image signal, in the internal memory 2230 or in the external memory 2400, which is outside the application processor 2200, may read out and decode the encoded image signal from the internal or external memory 2230 or 2400 and may display image data generated based on the decoded image signal. For example, one of the sub-processors 2212a, 2212b and 2212c of the image processor 2210 may decode the encoded image signal and may perform image processing on the decoded image signal. For example, the image data generated based on the decoded image signal may be displayed by the display 2500.

In the second operating mode, the camera modules 2100a, 2100b and 2100c may generate an image signal at a third speed lower than the first speed (e.g., at a third frame rate lower than the first frame rate) and may transmit the encoded image signal to the application processor 2200. The image signal provided to the application processor 2200 may be an unencoded signal. The application processor 2200 may perform image processing on the image signal provided thereto or may store the image signal provided thereto in the internal or external memory 2230 or 2400.

The PMIC 2300 may provide power, e.g., power supply voltages, to the camera modules 2100a, 2100b and 2100c. For example, the PMIC 2300 may provide first power to the camera module 2100a via a power signal line PSLa, second power to the camera module 2100b via a power signal line PSLb, and third power to the camera module 2100c via a power signal line PSLc under the control of the application processor 2200.

The PMIC 2300 may generate power for each of the camera modules 2100a, 2100b and 2100c in response to a power control signal PCON from the application processor 2200 and may control the level of the power. The power control signal PCON may include a power control signal for different operating modes of the camera modules 2100a, 2100b and 2100c. For example, the different operating modes may include a lower power mode, and the power control signal PCON may include information indicating which of the camera modules 2100a, 2100b and 2100c is to operate in the lower power mode and information indicating the level of power at which the camera module that is to operate in the lower power mode is to be set. The first power, the second power and the third power provided to the camera modules 2100a, 2100b and 2100c, respectively, may have the same level or different levels. Also, the level of the first power, the second power and the third power provided to the camera modules 2100a, 2100b and 2100c, respectively, may be dynamically controllable.

By way of summation and review, embodiments provide an image sensor with MTJ elements having different properties, and an image sensing device including the same. That is, embodiments provide an image sensor with two different types of MRAM which have nonvolatile and volatile memory. For example, the two different types of MRAM may be at different levels of the chip.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
an upper chip including a pixel array and a first connecting structure, the first connecting structure being connected to the pixel array; and
a lower chip below the upper chip, the lower chip including:
a second connecting structure connected to the first connecting structure, the second connecting structure having:
a first metal layer,
a second metal layer on the first metal layer, the second metal layer having a same thickness as the first metal layer,
a third metal layer on the second metal layer, the third metal layer being thicker than the second metal layer,
a fourth metal layer on the third metal layer, the fourth metal layer being thicker than the third metal layer,
a first insulating layer between the first and second metal layers,
a second insulating layer between the second and third metal layers, and
a third insulating layer between the third and fourth metal layers,
a first memory device having a first magnetic tunnel junction (MTJ) element, the first MTJ element being in at least one of the first and second insulating layers, and
a second memory device having a second MTJ element different from the first MTJ element, the second MTJ element being in at least one of the first through third insulating layers,
wherein a single first memory device has a larger storage capacity than a single second memory device.

2. The image sensor as claimed in claim 1, wherein the first MTJ element is in the first insulating layer and connects the first and second metal layers.

3. The image sensor as claimed in claim 2, wherein the second MTJ element is in the first insulating layer, the second MTJ element being spaced apart from the first MTJ element and connecting the first and second metal layers.

4. The image sensor as claimed in claim 2, wherein the second MTJ element is in the second insulating layer and connects the second and third metal layers.

5. The image sensor as claimed in claim 1, wherein:
the first MTJ element includes a first lower electrode connected to at least one of the first and second metal layers,
the second MTJ element includes a second lower electrode connected to at least one of the first through third metal layers, and
the first and second lower electrodes include different materials.

6. The image sensor as claimed in claim 1, wherein the first memory device is a frame buffer to store signals transmitted from the pixel array, only the first memory device among the first and second memory devices being electrically connected to the pixel array by a contact plug.

7. The image sensor as claimed in claim 6, wherein:
the lower chip further includes an image signal processor configured to perform image processing on signals stored in the frame buffer, and
the second memory device is configured to provide data to the image signal processor.

8. The image sensor as claimed in claim 1, wherein the second connecting structure further includes a first contact in at least one of the first and second insulating layers, the first contact being connected to the first MTJ element.

9. The image sensor as claimed in claim 8, wherein the second connecting structure further includes a second contact in at least one of the first through third insulating layers, the second contact being connected to the second MTJ element.

10. The image sensor as claimed in claim 1, wherein the first memory device is configured to have a faster operating speed than the second memory device.

11. The image sensor as claimed in claim 1, wherein the first memory device is configured to store signals transmitted from the pixel array in the first MTJ element.

12. The image sensor as claimed in claim 1, wherein a width of the first MTJ element is smaller than a width of the second MTJ element.

13. An image sensor, comprising:
an upper chip including a pixel array and a first connecting structure connected to the pixel array;
a middle chip below the upper chip, the middle chip including:
a second connecting structure connected to the first connecting structure, the second connecting structure having:
a first metal layer,
a second metal layer on the first metal layer and having a same thickness as the first metal layer,
a third metal layer on the second metal layer and thicker than the second metal layer,
a first insulating layer between the first and second metal layers, and
a second insulating layer between the second and third metal layers,
a first memory device including a first magnetic tunnel junction (MTJ) element, the first MTJ element being in at least one of the first and second insulating layers, and
a second memory device including a second MTJ element different from the first MTJ element, the second MTJ element being in a same insulation layer as the first MTJ element, and the second MTJ element having different properties from the first MTJ element; and
a lower chip below the middle chip, the lower chip including a third connecting structure connected to the second connecting structure.

14. The image sensor as claimed in claim 13, wherein:
the first MTJ element is in the first insulating layer and connects the first and second metal layers, and
the second MTJ element is in the first insulating layer, is spaced apart from the first MTJ element, and connects the first and second metal layers.

15. The image sensor as claimed in claim 13, wherein bottom surfaces of the first and second MTJ elements are coplanar.

16. The image sensor as claimed in claim 13, wherein:
the lower chip further includes a third MTJ element and a fourth MTJ element different from the third MTJ element, the third connecting structure includes:
- a fourth metal layer,
- a fifth metal layer on the fourth metal layer and having a same thickness as the fourth metal layer,
- a sixth metal layer on the fifth metal layer and being thicker than the fifth metal layer,
- a seventh metal layer on the sixth metal layer and being thicker than the sixth metal layer,
- a third insulating layer between the fourth and fifth metal layers,
- a fourth insulating layer between the fifth and sixth metal layers, and
- a fifth insulating layer between the fifth and sixth metal layers, the third MTJ element is in at least one of the third and fourth insulating layers, and the fourth MTJ element is in at least one of the third through fifth insulating layers.

17. An image sensing device, comprising:
an image sensor; and
an image signal processor configured to process an image signal provided from the image sensor,
wherein the image sensor includes:
- a pixel array,
- a connecting structure configured to receive signals generated by the pixel array,
- a first memory device having a first magnetic tunnel junction (MTJ) element, and
- a second memory device having a second MTJ element with different properties from the first MTJ element, wherein the connecting structure includes a first metal layer, a second metal layer on the first metal layer, a third metal layer on the second metal layer, a fourth metal layer on the third metal layer, a first insulating layer between the first and second metal layers, a second insulating layer between the second and third metal layers, and a third insulating layer between the third and fourth metal layers, wherein the first MTJ element is in at least one of the first and second insulating layers, wherein the second MTJ element is in at least one of the first through third insulating layers, a single second MTJ element having a smaller storage capacity than a single first MTJ element, wherein the first memory device is configured to store signals generated by the pixel array in the first MTJ element, and to provide the stored signals to the image signal processor, and wherein the second memory device is configured to store data read out from the second MTJ element, and to provide the stored data to the image signal processor.

18. The image sensing device as claimed in claim 17, wherein the image signal processor is configured to perform image processing on signals provided by the first memory device, using data provided by the second memory device.

19. The image sensing device as claimed in claim 17, wherein the third metal layer is thicker than the second metal layer, and the fourth metal layer is thicker than the third metal layer.

* * * * *